United States Patent
Ishizawa et al.

(10) Patent No.: US 7,915,743 B2
(45) Date of Patent: Mar. 29, 2011

(54) ADHESIVE FOR ELECTRONIC COMPONENTS, METHOD FOR MANUFACTURING SEMICONDUCTOR CHIP LAMINATE, AND SEMICONDUCTOR DEVICE

(75) Inventors: Hideaki Ishizawa, Osaka (JP); Akinobu Hayakawa, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 247 days.

(21) Appl. No.: 12/309,324

(22) PCT Filed: Jul. 19, 2007

(86) PCT No.: PCT/JP2007/064274
§ 371 (c)(1),
(2), (4) Date: Feb. 18, 2009

(87) PCT Pub. No.: WO2008/010555
PCT Pub. Date: Jan. 24, 2008

(65) Prior Publication Data
US 2009/0311827 A1 Dec. 17, 2009

(30) Foreign Application Priority Data

Jul. 20, 2006 (JP) ................................. 2006-198311
Jan. 10, 2007 (JP) ................................. 2007-002803
Jan. 12, 2007 (JP) ................................. 2007-005092

(51) Int. Cl.
*H01L 23/48* (2006.01)
*H01L 23/52* (2006.01)
*H01L 29/40* (2006.01)
*H01L 21/00* (2006.01)

(52) U.S. Cl. ................ 257/783; 438/118; 257/E23.018; 257/E21.514

(58) Field of Classification Search .................. 257/783, 257/E23.018, E21.514; 438/118
See application file for complete search history.

(56) References Cited

FOREIGN PATENT DOCUMENTS

| EP | 0219242 A2 | 4/1987 |
| JP | 10-4174 | 1/1998 |
| JP | 11-189765 | 7/1999 |
| JP | 2003-179200 | 6/2003 |
| JP | 2005-216973 | 8/2005 |
| JP | 2005320404 | 11/2005 |
| JP | 2006-66816 | 3/2006 |
| JP | 2007-169448 | 7/2007 |
| WO | 2008/084843 | 7/2008 |

OTHER PUBLICATIONS

International Search Report issued Aug. 6, 2007 in the International (PCT) Application of which the present application is in the U.S. National Stage.
Extended European Search Report on counterpart EP Application No. 07791028.9.

*Primary Examiner* — David A Zarneke
(74) *Attorney, Agent, or Firm* — Wenderoth, Lind & Ponack, L.L.P.

(57) ABSTRACT

It is an object of the present invention to provide: an adhesive for electronic parts that makes it possible to accurately maintain a distance between electronic parts upon joining electronic parts such as two or more semiconductor chips and also to obtain reliable electronic parts such as a semiconductor device; a method for producing a semiconductor chip laminated body using the adhesive for electronic parts; and a semiconductor device using the adhesive for electronic parts. The present invention is an adhesive for electronic parts configured to join the electronic parts, which contains: an adhesive composition comprising a curing compound and a curing agent; and spacer particles having a CV value of 10% or less, a viscosity at 1 rpm being 200 Pa·s or less and a viscosity at 10 rpm being 100 Pa·s or less, upon being measured at 25° C. by using an E type viscometer, and a viscosity at 0.5 rpm being 1.4 to 3 times as large as the viscosity at 1 rpm, and the viscosity at 1 rpm being 2 to 5 times as large as the viscosity at 10 rpm.

17 Claims, 1 Drawing Sheet

US 7,915,743 B2

ADHESIVE FOR ELECTRONIC COMPONENTS, METHOD FOR MANUFACTURING SEMICONDUCTOR CHIP LAMINATE, AND SEMICONDUCTOR DEVICE

This application is a U.S. national stage of International Application No. PCT/JP2007/064274 filed Jul. 19, 2007.

TECHNICAL FIELD

The present invention relates to: an adhesive for electronic parts that makes it possible to accurately maintain a distance between electronic parts upon joining the electronic parts such as two or more semiconductor chips and also to obtain reliable electronic parts such as a semiconductor device; a method for producing a semiconductor chip laminated body using the adhesive for electronic parts; and a semiconductor device using the adhesive for electronic parts.

BACKGROUND ART

Along with requirements in recent years for electronic parts, such as semiconductor packages to begin with, to be compact, there has been a growing trend toward three-dimensional mounting in which a plurality of electronic parts are laminated to obtain a multilayered semiconductor chip laminated body. Moreover, ongoing research has been conducted to achieve further miniaturization of electronic parts such as a semiconductor chip laminated body.

Consequently, a semiconductor chip, for example, has come to serve as an extremely thin film, and also a fine wiring has been formed in a semiconductor chip. In the semiconductor chip laminated body formed by the three-dimensional mounting, each of the semiconductor chips needs to be laminated horizontally without any damage.

In contrast, there have been conventionally examined a method of protecting wires of a lower semiconductor chip in order to obtain a reliable semiconductor chip laminated body, a method of interposing a spacer chip between semiconductor chips so that the semiconductor chips are horizontally laminated, and the like. As such a method, Patent Document 1, for example, discloses a method of forming spacers in a scattered manner on a face of one semiconductor chip on which the other semiconductor chip is to be laminated, upon laminating a plurality of semiconductor chips, and thereafter laminating the other semiconductor chip.

However, the method of this kind finds it extremely difficult to control the thickness and shape of spacers so as to achieve sufficient miniaturization of a semiconductor chip laminated body and horizontal lamination with a high degree of accuracy. This method also suffers from the problem of complicated processes.

Further, Patent Document 2 discloses a method of laminating dummy chips and spacers between semiconductor chips to be connected, upon laminating a plurality of semiconductor chips.

However, in the semiconductor chip laminated body obtained by such a method, problematically, a large thickness of the entire semiconductor chip laminated body causes difficulty in lowering the height of a package and requires an additional process of laminating dummy chips.

On the other hand, an adhesive containing spacer particles is under investigation.

Patent Document 3, for example, discloses the adhesive having hard plastic fine particles as essential components, the particles having a particle diameter that virtually determines the film thickness after curing the adhesive, and also discloses that silicon elements can be adhered to a lead frame by an adhesive layer having an thickness equivalent to an average particle diameter of the fine particles of 20 μm.

However, even in the case of using the adhesive containing such spacer particles, the problem of a thickness variation of adhesive layers of the obtained laminated body remains to be solved (for example, in Examples of Patent Document 3, the difference between the maximum and minimum thicknesses is as large as 3 to 5 μm), and the mere addition of spacer particles having substantially the same film thickness as the desired film thickness problematically cannot accurately control the film thickness.

Patent Document No. 1: Japanese Kokai Publication 2003-179200;
Patent Document No. 2: Japanese Kokai Publication 2006-66816;
Patent Document No. 3: Japanese Kokai Publication Hei-11-189765

DISCLOSURE OF THE INVENTION

Problems to be Solved by the Invention

In view of the above-mentioned state of the art, it is an object of the present invention to provide: an adhesive for electronic parts that makes it possible to accurately maintain a distance between electronic parts upon joining the electronic parts such as two or more semiconductor chips and also to obtain reliable electronic parts such as a semiconductor device; a method for producing a semiconductor chip laminated body using the adhesive for electronic parts; and a semiconductor device using the adhesive for electronic parts.

Means for Solving the Problems

The present invention is an adhesive for electronic parts configured to join the electronic parts, which contains: an adhesive composition comprising a curing compound and a curing agent; and spacer particles having a CV value of 10% or less, a viscosity at 1 rpm being 200 Pa·s or less and a viscosity at 10 rpm being 100 Pa·s or less, upon being measured at 25° C. by using an E type viscometer, and a viscosity at 0.5 rpm being 1.4 to 3 times as large as the viscosity at 1 rpm, and the viscosity at 1 rpm being 2 to 5 times as large as the viscosity at 10 rpm.

The following discussion will describe the present invention in detail.

The present inventors have made intensive research and consequently found that it is possible to accurately maintain a distance between electronic parts upon joining the electronic parts by using an adhesive for electronic parts comprising an adhesive composition and spacer particles having a CV value within a predetermined range, and the adhesive having a viscosity property within a predetermined range upon being measured at 25° C. by using an E type viscometer, and that it is also possible to obtain highly reliable electronic parts, thereby leading to completion of the present invention.

In the adhesive for electronic parts according to the present invention, the upper limit of a viscosity at 1 rpm is 200 Pa·s and the upper limit of a viscosity at 10 rpm is 100 Pa·s, upon being measured at 25° C. by using an E type viscometer, and a viscosity at 0.5 rpm is 1.4 to 3 times as large as the viscosity at 1 rpm, and the viscosity at 1 rpm is 2 to 5 times as large as the viscosity at 10 rpm.

By setting the viscosity measured at 25° C. within the above-mentioned range by using the E type viscometer in the adhesive for electronic parts of the present invention, in the process of applying the adhesive for electronic parts to semiconductor chips upon using the adhesive for producing a semiconductor chip laminated body, for example, it is possible to favorably apply the adhesive in the desired shape and maintain the shape of the adhesive until the lamination of the other semiconductor chip. Also, in the process of laminating the other semiconductor chip, pressurizing after positioning causes an excess amount of the adhesive for electronic parts to overflow sufficiently, and allows the distance between semiconductor chips (hereinafter, also referred to as the distance between chips) to be substantially identical to the particle diameter of each spacer particle.

In the adhesive for electronic parts according to the present invention, the upper limit of a viscosity at 1 rpm is 200 Pa·s, upon being measured at 25° C. by using the E type viscometer. At the viscosity exceeding 200 Pa·s, the adhesive exhibits a high viscosity upon use of the adhesive for producing a semiconductor chip laminated body with a short distance between chips, which makes it difficult to reduce the distance between chips to the extent of the particle diameter of each spacer particle, leading to marked difficulty especially in the case where the distance between chips is 25 μm or less. The preferable upper limit thereof is 150 Pa·s.

Moreover, the preferable lower limit of a viscosity at 1 rpm is 50 Pa·s. The viscosity of less than 50 Pa·s may make it difficult to maintain the shape of the adhesive upon application, until the lamination of the other semiconductor chip after application. Also, in the case of using a wire-bonding-type semiconductor chip for lamination, for example, the adhesive for electronic parts together with the spacer particles may flow into the electrode area for wire bonding.

In the adhesive for electronic parts according to the present invention, the upper limit of the viscosity at 10 rpm is 100 Pa·s, upon being measured at 25° C. by using the E type viscometer. The viscosity exceeding 100 Pa·s makes it difficult to apply the adhesive in the desired shape. The preferable upper limit thereof is 75 Pa·s.

Moreover, the preferable lower limit of the viscosity at 10 rpm is 5 Pa·s. The viscosity of less than 5 Pa·s may make it difficult to maintain the shape of the adhesive upon application, until the lamination of the other semiconductor chip after application. Also, in the case of using a wire-bonding-type semiconductor chip for lamination, for example, the adhesive for electronic parts together with the spacer particles may flow into the electrode area for wire bonding.

In the adhesive for electronic parts according to the present invention, the lower limit of the viscosity at 0.5 rpm is 1.4 times and the upper limit thereof is 3 times as large as the viscosity at 1 rpm, upon being measured at 25° C. by using the E type viscometer. The viscosity of less than 1.4 times makes it difficult to maintain the shape of the adhesive upon application, until the lamination of the other semiconductor chip after application. At the viscosity exceeding 3 times, the adhesive exhibits a high viscosity upon use of the adhesive for producing a semiconductor chip laminated body with approximately 20 μm in distance between chips, and pressurizing does not cause an excess adhesive for electronic parts to overflow; which makes it difficult to reduce the distance between chips to the extent of the particle diameter of each spacer particle. The preferable lower limit thereof is 2 times as large.

In the adhesive for electronic parts according to the present invention, the lower limit of the viscosity at 1 rpm is 2 times and the upper limit thereof is 5 times as large as the viscosity at 10 rpm, upon being measured at 25° C. by using an E type viscometer. The viscosity of less than 2 times makes it difficult to maintain the shape that is drawn after the application of the adhesive for electronic parts of the present invention. At the viscosity exceeding 5 times, the adhesive exhibits a high viscosity upon use of the adhesive for producing a semiconductor chip laminated body with a short distance between chips, which makes it difficult to reduce the distance between chips to the extent of the particle diameter of each spacer particle, leading to marked difficulty especially in the case where the distance between chips is 25 μm or less. The preferable upper limit thereof is 3 times as large.

Moreover, when the adhesive for electronic parts of the present invention may be used for joining the electronic parts at a temperature of more than 25° C. At this time, in the adhesive for electronic parts according to the present invention, the viscosity at 10 rpm is preferably 10 Pa·s or less, upon being measured at a temperature at a time of joining the electronic parts (hereinafter, also referred to as a joining temperature) by using the E type viscometer. At the viscosity exceeding 10 Pa·s, failure to exclude an excess adhesive for electronic parts between spacer particles and electronic parts upon joining the electronic parts with the adhesive for electronic parts makes it difficult to reduce the distance between chips to the extent of the particle diameter of each spacer particle. The preferable upper limit thereof is 1 Pa·s.

Here, although not particularly limited thereto, the joining temperature is usually approximately 50 to 100° C.

The adhesive for electronic parts of the present invention contains a curing compound.

The curing compound is not particularly limited, and examples thereof include compounds cured by addition polymerization, polycondensation, polyaddition, addition condensation, and ring-opening polymerization reaction.

Specific examples thereof include thermosetting compounds such as a urea compound, a melamine compound, a phenolic compound, a resorcinol compound, an epoxy compound, an acrylic compound, a polyester compound, a polyamide compound, a polybenzimidazole compound, a diallyl phthalate compound, a xylene compound, an alkylbenzene compound, an epoxy acrylate compound, a silicon compound, and a urethane compound. Among others, due to excellent reliability and joining strength of an electronic device such as a semiconductor device to be obtained after joining, the epoxy compound and the acrylic compound are preferable, and an epoxy compound having an imide skeleton is more preferable.

The epoxy compound is not particularly limited, and examples thereof include: bisphenol type epoxy resins such as bisphenol A type, bisphenol F type, bisphenol AD type, and bisphenol S type; novolak type epoxy resins such as phenol novolak type and cresol novolak type; aromatic epoxy resins such as trisphenolmethane triglycidyl ether; a naphthalene type epoxy resin; a biphenyl type epoxy resin; a fluorene type epoxy resin; a dicyclopentadiene type epoxy resin; a resorcinol type epoxy resin; their hydrogenated products; and the like. Among others, the epoxy compound preferably contains at least one resin selected from the group consisting of a naphthalene type epoxy resin, a fluorene type epoxy resin, and a resorcinol type epoxy resin because it is possible to obtain an adhesive for electronic parts having a higher heat resistance.

Examples of commercial products of the naphthalene type epoxy resin include HP-4032, HP-4032D, HP-4700, HP-4701 (all produced by DIC Corporation), and the like. Also, examples of commercial products of the fluorene type epoxy resin include EX-1010, 1011, 1012, 1020, 1030, 1040, 1050, 1051, 1060 (all produced by Nagase ChemteX Corporation), and the like; and examples of commercial products of the resorcinol type epoxy resin include EX-201 (produced by Nagase ChemteX Corporation), and the like.

The softening temperature of the naphthalene type epoxy resin, the fluorene type epoxy resin, and the resorcinol type epoxy resin is preferably 60° C. or less. The use of the resins having a softening temperature of 60° C. or less makes it possible to reduce the added amount of liquid components such as diluents used for decreasing the viscosity of the adhesive for electronic parts, and also to obtain an adhesive for electronic parts containing little volatile component upon and after curing. The resins having a softening temperature of 40° C. or less are more preferable, and those having a softening temperature of room temperature or lower are further preferable. HP-4032 and HP-4032D, EX-1020, and EX-201 are preferable among the commercial products.

In the case of using as the curing compound at least one resin selected from the group consisting of the naphthalene type epoxy resin, the fluorene type epoxy resin, and the resorcinol type epoxy resin, the preferable lower limit of a blending amount of at least one resin selected from the group consisting of the naphthalene type epoxy resin, the fluorene type epoxy resin, and the resorcinol type epoxy resin is 40% by weight. The blending amount of less than 40% by weight may cause failure to obtain an adhesive for electronic parts having sufficient heat resistance. The more preferable lower limit thereof is 60% by weight. Moreover, the preferable upper limit thereof is 90% by weight.

Further, utilizable as the epoxy compounds are epoxy compounds including: rubber modified epoxy compounds containing rubber components, such as NBR, CTBN, polybutadiene, and acrylic rubber; and flexible epoxy compounds. Upon use of such epoxy compounds, flexibility can be imparted after curing, leading to excellence in heat resistance such as a temperature resistance cycle. Moreover, conventionally known epoxy compounds may also be used.

In the adhesive for electronic parts of the present invention, preferably, the curing compound has a molecular structure of a deca- or less-mer with an aromatic ring in its repeat unit and contains an epoxy compound (A) existing as a crystalline solid at 25° C. By containing the epoxy compound (A), it is possible for the adhesive for electronic parts of the present invention to achieve favorable viscosity characteristics at the aforementioned joining temperature.

The epoxy compound (A) has a molecular structure of a deca- or less-mer with an aromatic ring in its repeat unit. The epoxy compound (A) of this kind has extremely high crystallinity, exists as a crystalline solid at 25° C., and has characteristics that its viscosity sharply decreases in the temperature range higher than 25° C. This is presumably because although the epoxy compound (A) exists as a crystalline solid at 25° C. as described above, since the (A) has a low molecular weight of a deca- or less-mer, heating at more than 25° C. makes its crystal structure broken and decreases the viscosity. More specifically, the epoxy compound (A) exists as a crystalline solid at 25° C., and the upper limit of the viscosity is 1 Pa·s upon being measured at the temperature range of 50 to 80° C. by using an E type viscometer. When the epoxy compound (A) has the molecular structure of a undeca- or more-mer, the viscosity at the temperature range of 50 to 80° C. increases; when lamination of electronic parts and the like are performed at the aforementioned joining temperature by using the adhesive for electronic parts of the present invention, it is difficult to make the distance between electronic parts substantially identical to the particle diameter of each spacer particle, resulting in a distance variation between electronic parts. The epoxy compound (A) preferably has the molecular structure of a tri- or less-mer. Here, taking into account temperature conditions upon heating and pressurizing electronic parts in the process of producing the usual electronic parts laminated body, the temperature range was set to 50 to 80° C. at the viscosity of 1 Pa·s. Moreover, considering that application for joining electronic parts is normally conducted at room temperature, the temperature at which the epoxy compound (A) exists as a crystalline solid was set to 25° C.

By using the adhesive for electronic parts of the present invention having such a molecular structure, i.e., having an aromatic ring in its repeat unit and containing an epoxy compound (A) having the molecular structure of a deca- or less-mer, it is possible to accurately maintain a distance between electronic parts upon joining the electronic parts and the like and also to obtain reliable electronic parts.

That is, since the epoxy compound (A) has an aromatic ring in its repeat unit and thereby exists as a crystalline solid at 25° C., the adhesive for electronic parts of the present invention containing the epoxy compound (A) has a high viscosity at 25° C., and the application shape is never lost upon application of the adhesive to electronic parts to be joined. Moreover, since the epoxy compound (A) rapidly, upon being heated, achieves a low viscosity, it is possible, upon lamination of electronic parts, for example, to laminate one electronic part on another electronic part without any adhesive remaining between spacer particles and electronic parts, and also to make the distance between electronic parts substantially identical to the particle diameter of each spacer particle. In addition, upon returning the temperature after lamination of electronic parts to 25° C., the viscosity of the epoxy compound (A) rapidly increases, with the result that the adhesive for electronic parts after lamination of electronic parts is never lost. Excellent heat resistance of the epoxy compound (A) involves excellent heat resistance of the adhesive for electronic parts of the present invention containing this epoxy compound (A).

Here, an adhesive that realizes a low viscosity upon heating by mere addition of a diluent has been known as a conventional adhesive used for joining electronic parts, but such a conventional adhesive has the problem of causing voids upon heating. However, since the adhesive for electronic parts of the present invention containing the epoxy compound (A) realizes a low viscosity upon heating by containing the epoxy compound (A), voids are never generated just as in the case of the conventional adhesive that realizes a low viscosity upon heating by mere addition of a diluent.

That is, when the adhesive for electronic parts of the present invention serves as an adhesive layer having a thickness of 10 μm and a cured material obtainable by curing the adhesive layer at 170° C. for 15 minutes is exposed to a temperature condition of 260° C. for 10 seconds, the preferable upper limit of occurrence of voids having a diameter of 100 μm or less is 1 piece/mm$^2$. When the occurrence of voids of the cured material exceeds 1 piece/mm$^2$, joining reliability between electronic parts may be insufficient upon joining electronic parts by using the adhesive for electronic parts of the present invention.

The epoxy compound (A) preferably has two or more epoxy groups in one molecule. Containing the epoxy compound (A) of such a molecular structure will lead to excellent adhesion of the adhesive for electronic parts of the present invention.

The epoxy compound (A) of this kind is not particularly limited as long as it has the above-mentioned molecular structure, and example thereof include a phenol type epoxy resin, a naphthalene type epoxy resin, a biphenyl type epoxy resin, a resorcinol type epoxy resin, and the like. Examples of commercial products of such an epoxy compound (A) include EX-201 (produced by Nagase & Co., Ltd.), YSLV-80XY (produced by Tohto Kasei Co., Ltd.), and the like.

In the adhesive for electronic parts of the present invention, preferably, the curing compound has epoxy groups at both ends of a molecule and contains an epoxy compound (B) having a flexible skeleton having a number-average molecular weight of 50 to 1,000 between one epoxy group and the other epoxy group.

When the adhesive for electronic parts of the present invention contains the epoxy compound (B), since the cured material of the adhesive for electronic parts of the present invention exhibits excellent adhesion between electronic parts and a substrate while attaining a low elastic modulus within the range of normal temperature, leading to excellence in heat resistance such as a temperature resistance cycle.

The epoxy compound (B) is not particularly limited, and examples thereof include 1,2-polybutadiene modified bisphenol A glycidyl ether, 1,4-polybutadiene modified bisphenol A glycidyl ether, polypropylene oxide modified bisphenol A glycidyl ether, polyethylene oxide modified bisphenol A glycidyl ether, acrylic rubber modified bisphenol A glycidyl ether, urethane resin modified bisphenol A glycidyl ether, polyester resin modified bisphenol A glycidyl ether, 1,2-polybutadiene modified glycidyl ether, 1,4-polybutadiene modified glycidyl ether, polypropylene oxide modified glycidyl ether, polyethylene oxide modified glycidyl ether, acrylic rubber modified glycidyl ether, urethane resin modified glycidyl ether, polyester resin modified glycidyl ether, these hydrogenated products, and the like. These epoxy compounds (B) may be used independently, or two or more kinds thereof may be used in combination. Preferably used among them is an epoxy compound in which the flexible skeleton derives from at least one compound selected from the group consisting of butadiene rubber, propylene oxide, ethylene oxide, acrylic rubber, and their hydrogenated products.

In addition, due to their higher reaction speed, there are suitably employed epoxy compounds having aromatic skeletons, such as 1,2-polybutadiene modified bisphenol A glycidyl ether, 1,4-polybutadiene modified bisphenol A glycidyl ether, polypropylene oxide modified bisphenol A glycidyl ether, polyethylene oxide modified bisphenol A glycidyl ether, acrylic rubber modified bisphenol A glycidyl ether, urethane resin modified bisphenol A glycidyl ether, and polyester resin modified bisphenol A glycidyl ether.

Out of the epoxy compounds (B), those in which a glycidyl ether group is directly bonded with an aromatic ring are preferable due to a further accelerated reaction speed. Examples of such commercially available epoxy compounds include EPB-13 (produced by Nippon Soda Co., Ltd.), EXA-4850 (produced by DIC Corporation), and the like.

The curing compound preferably further contains an organic-inorganic hybrid epoxy compound. By containing the organic-inorganic hybrid epoxy compound, it is possible to raise the elastic modulus of the adhesive for electronic parts of the present invention to the desired value.

The organic-inorganic hybrid epoxy compound is not particularly limited, and examples thereof include Compoceran E102 (produced by Arakawa Chemical Industries, Ltd.); and the like.

A blending amount in the case of containing the organic-inorganic hybrid epoxy compound is not particularly limited, and the preferable lower limit thereof is 1 part by weight and the preferable upper limit thereof is 10 parts by weight, with respect to the total of 100 parts by weight of the curing compound contained in the adhesive for electronic parts of the present invention such as the aforementioned epoxy compound (B).

The preferable upper limit of moisture absorption of the cured compound is 1.5%, and the more preferable upper limit thereof is 1.1%. Examples of the curing compound having such moisture absorption include a naphthalene type epoxy resin, a fluorene type epoxy resin, a dicyclopentadiene type epoxy resin, a phenol novolak type epoxy resin, a cresol novolak type resin.

The adhesive for electronic parts of the present invention preferably further contains a polymer compound having a functional group reactable with the curing compound. Joining reliability upon occurrence of distortion by heat is improved by containing such a polymer compound.

As a polymer compound having a functional group reactable with the curing compound, upon using an epoxy compound as the curing compound, there may be mentioned: polymer compounds having an amino group, a urethane group, an imido group, a hydroxyl group, a carboxyl group, an epoxy group, etc; and the like. The polymer compound having an epoxy group is preferable among these. Addition of the polymer compound having the epoxy group enables the cured material of the adhesive for electronic parts to exhibit excellent flexibility. That is, since the cured material of the adhesive for electronic parts of the present invention simultaneously has: excellent mechanical strength, heat resistance, and moisture resistance derived from an epoxy compound (a curing compound) having a polycyclic hydrocarbon skeleton as a main chain; and excellent flexibility derived from a polymer compound having the epoxy group, the cured material is excellent in resistance to thermal cycles, resistance to solder reflow, size stability, and the like, and provides high adhesion reliability and conduction reliability.

The polymer compound having the epoxy group is not particularly limited as long as it is a polymer compound having an epoxy group at its ends and/or side chains (pendant sites), and examples thereof include an epoxy group-containing acrylic rubber, an epoxy group-containing butadiene rubber, a bisphenol type high-molecular-weight epoxy resin, an epoxy group-containing phenoxy resin, an epoxy group-containing acrylic resin, an epoxy group-containing urethane resin, an epoxy group-containing polyester resin, and the like. Since it is possible to obtain a polymer compound containing many epoxy groups and also a cured material having excellent mechanical strength and heat resistance, the epoxy group-containing acrylic resin is favorably used among these. These polymer compounds having an epoxy group may be used independently, or two or more kinds thereof may be used in combination.

In the case of using a polymer compound having the epoxy group, especially an epoxy group-containing acrylic resin, as a polymer compound having a functional group reactable with the curing compound, the preferable lower limit of a weight-average molecular weight is 10,000. When it is less than 10,000, a film forming property of the adhesive for electronic parts of the present invention is insufficient, so that the flexibility of the cured material of the adhesive for electronic parts may not be sufficiently improved.

In the case of using a polymer compound having the epoxy group, especially an epoxy group-containing acrylic resin, as a polymer compound having a functional group reactable with the curing compound, the preferable lower limit of an epoxy equivalent is 200, and the preferable upper limit thereof is 1,000. When it is less than 200, flexibility of the adhesive for electronic parts of the present invention may not be sufficiently improved; on the other hand, when it exceeds 1,000, the mechanical strength and heat resistance of the cured material of the adhesive for electronic parts of the present invention may be insufficient.

A blending amount of a polymer compound having a functional group reactable with the curing compound is not particularly limited, and the preferable lower limit thereof is 1 part by weight and the preferable upper limit thereof is 20 parts by weight, with respect to 100 parts by weight of the curing compound. When it is less than 1 part by weight, sufficient reliability for heat distortion may not be obtained; when it exceeds 20 parts by weight, its heat resistance may be lowered.

The adhesive for electronic parts of the present invention may contain a diluent for the purpose of: securing an application property at 25° C.; and the like.

The diluent is not particularly limited, and examples thereof include a reactive diluent, a nonreactive diluent, and the like. The reactive diluent is suitably used among others.

The reactive diluent may contain an epoxy compound (A2). It is possible to adjust viscosities and also glass transition temperatures by containing such an epoxy compound (A2).

The epoxy compound (A2) is not particularly limited, and examples thereof include: a bisphenol A type epoxy resin, a bisphenol F type epoxy resin, and an epoxy compound having a molecular structure of a deca- or less-mer with an aliphatic cyclic skeleton; and the like.

A content of the epoxy compound (A2) is not particularly limited, and the preferable lower limit thereof is 10 parts by weight and the preferable upper limit thereof is 60 parts by weight, with respect to the total of 100 parts by weight of the curing compound contained in the adhesive for electronic parts of the present invention. When it is less than 10 parts by weight, the effects attributed to addition of the epoxy compound (A2) can hardly be obtained. On the other hand, when it exceeds 60 parts by weight, the below-mentioned viscosity characteristics in the adhesive for electronic parts of the present invention may not be obtained. The more preferable lower limit thereof is 20 parts by weight, and the more preferable upper limit thereof is 30 parts by weight.

Moreover, in the case where the curing compound contains the above-mentioned epoxy compound (A), the epoxy compound (A3) having a molecular structure of a deca- or less-mer with an aliphatic cyclic skeleton in its repeat unit is suitably used as the reactive diluent. By containing the epoxy compound (A3) of such a molecular structure, the adhesive for electronic parts of the present invention comes to have high moisture resistance while securing an application property at 25° C.

When the epoxy compound (A3) has the molecular structure of an undeca- or more-mer, a viscosity of the adhesive for electronic parts of the present invention at 25° C. may be higher, and an application property for electronic parts may be insufficient. The epoxy compound (A3) more preferably has the molecular structure of a penta- or less-mer.

The epoxy compound (A3) is not particularly limited as long as it has the above-mentioned molecular structure, and example thereof include a dicyclopentadiene type epoxy resin, a cyclohexane type epoxy resin, and the like. Examples of commercial products of such an epoxy compound (A3) include EP-4088S (produced by ADEKA Corporation), HP-7200 (produced by DIC Corporation), and the like.

In the case where the adhesive for electronic parts of the present invention contains the epoxy compound (A3), with respect to the blending ratio of the above-mentioned epoxy compound (A) to the above-mentioned epoxy compound (A3), i.e., (A3/A) or (A/A3), the preferable lower limit thereof is 0.5 and the preferable upper limit thereof is 2. When the blending ratio becomes less than 0.5 or more than 2, the blending ratio of either one of the epoxy compound (A) or the epoxy compound (A3) increases, and it becomes difficult to simultaneously impart the characteristics such as the above-mentioned viscosity characteristics and high moisture resistance to the adhesive for electronic parts of the present invention.

In the case where the blending ratio (A3/A) of the epoxy compound (A) to the epoxy compound (A3) is less than 0.5, for example, moisture resistance sufficient for the adhesive for electronic parts of the present invention may not be obtained. In the case where the blending ratio (A/A3) of the epoxy compound (A3) to the epoxy compound (A) is less than 0.5, the above-mentioned viscosity characteristics may not be obtained in the adhesive for electronic parts of the present invention.

A content of the epoxy compound (A3) in the adhesive for electronic parts of the present invention is not particularly limited, and the preferable lower limit thereof is 10 parts by weight and the preferable upper limit thereof is 30 parts by weight, with respect to the total of 100 parts by weight of the curing compound contained in the adhesive for electronic parts of the present invention. When it is less than 10 parts by weight, the effects of adding the epoxy compound (A3) can hardly be obtained. On the other hand, when it exceeds 30 parts by weight, the above-mentioned viscosity characteristics in the adhesive for electronic parts of the present invention may not be obtained. The more preferable upper limit thereof is 20 parts by weight.

Moreover, the nonreactive diluent is not particularly limited within limits not hindering the object of the present invention, and examples thereof include aromatic hydrocarbons, chlorinated aromatic hydrocarbons, chlorinated aliphatic hydrocarbons, alcohols, esters, ethers, ketones, glycol ethers (cellosolves), alicyclic hydrocarbons, aliphatic hydrocarbons, and the like.

A content of the nonreactive diluent is not particularly limited, and the preferable lower limit thereof is 1% by weight and the preferable upper limit thereof is 20% by weight. When it is less than 1% by weight, the effects of adding the nonreactive diluent can hardly be obtained. On the other hand, when it exceeds 20% by weight, voids may occur in the cured material of the adhesive for electronic parts of the present invention.

In the case where the adhesive for electronic parts of the present invention contains the above-mentioned diluent, the preferable upper limit of a weight loss of the diluent at 120° C. and a weight loss of the diluent at 150° C. is 1%. When it exceeds 1%, an unreacted material volatilizes upon and after curing the adhesive for electronic parts of the present invention, and may have an adverse effect on productivity thereof and the electronic parts device to be obtained.

Moreover, preferably, the diluent has a lower curing-starting temperature and a higher curing speed than those of the curing compounds such as the above-mentioned epoxy compound (A).

The adhesive for electronic parts of the present invention contains a curing agent.

The curing agent is not particularly limited, and a conventionally known curing agent can be appropriately selected according to the curing compound. Examples of the curing agent upon use of an epoxy compound as a curing compound include: heat curing acid anhydride type curing agents such as trialkyltetrahydrophthalic anhydride; phenol type curing agents; amine type curing agents; latent curing agents such as dicyandiamide; and cationic catalytic type curing agents; and the like. These curing agents may be used independently, or two or more kinds may be used in combination.

A blending amount of the curing agent is not particularly limited, and preferably 90 to 110 in an equivalent amount with respect to the amount of functional groups of the curing compound upon use of the curing agent that reacts with the functional groups of the curing compound in an equivalent amount. Moreover, in the case where a curing agent that functions as a catalyst is used, the preferable lower limit thereof is 1 part by weight and the preferable upper limit thereof is 20 parts by weight, with respect to 100 parts by weight of the curing compound.

The preferable lower limit of a melting point of the curing agent is 120° C. The melting point of 120° C. or more makes it possible to prevent gelation, and suitably join electronic parts and adjust a distance between electronic parts.

Examples of the curing agent whose melting point is 120° C. or more includes: 5-(2,5-dioxotetrahydro-3-furanyl)-3-methyl-3-cyclohexene-1,2-dicarboxylic anhydride; phenol novolak resins such as TD-2090; bisphenol A novolak resins such as KH-6021; orthocresol novolak resins such as KA-1165; and dicyandiamides such as EH-3636AS, EH-3842, EH-3780, EH-4339S, and EH-4346S (all produced by ADEKA Corporation).

In addition, microcapsule type curing agents coated with a material whose melting point is 120° C. or more can be suitably used.

The adhesive for electronic parts of the present invention contains spacer particles having a CV value of 10% or less. By containing such spacer particles, it is possible to keep the interval of semiconductor chips constant without any dummy chip, etc. interposed between the semiconductor chips upon lamination of two or more semiconductor chips by using the adhesive for electronic parts of the present invention.

The upper limit of a CV value of the spacer particles is 10%. The CV value exceeding 10% makes it difficult to keep the interval between electronic parts constant due to a large variation of particle diameters, leading to failure to sufficiently function as spacer particles. The preferable upper limit thereof is 6%, and the more preferable upper limit thereof is 4%.

Here, the CV value in the present description refers to a numerical value obtained by the following equation (1).

$$CV \text{ value (\%) of particle diameter} = (\sigma 2/Dn2) \times 100 \quad (1)$$

In the equation (1), σ2 represents a standard deviation of particle diameters and Dn2 represents a number-average particle diameter.

An average particle diameter of the spacer particles is not particularly limited, and the particle diameter can be selected so as to achieve the desired distance between chips. The preferable lower limit thereof is 3 μm, and the preferable upper limit thereof is 200 μm. The average particle diameter of less than 3 μm may make it difficult to reduce the distance between chips to the extent of the particle diameter of each spacer particle, and the average particle diameter exceeding 200 μm may unnecessarily increase the interval between semiconductor chips. The more preferable lower limit thereof is 5 μm, and the more preferable upper limit thereof is 50 μm.

The average particle diameter of the spacer particles is preferably 1.1 times as large as the average particle diameter of the solid material that is added in addition to spacer particles. The average particle diameter of less than 1.1 times may make it difficult to surely reduce the distance between chips to the extent of the particle diameter of each spacer particle. That is more preferably 1.2 times or more.

With respect to a K value of the spacer particles represented by the following equation (2), the preferable lower limit thereof is 980 N/mm², and the preferable upper limit thereof is 4,900 N/mm².

$$K=(3/\sqrt{2}) \cdot F \cdot S^{-3/2} \cdot R^{-1/2} \quad (2)$$

In the equation (2), F and S represent a load value (kgf) at 10% compressive deformation of each resin fine particle, and compression displacement (mm), respectively, and R represents a radius (mm) of the spacer.

The K value can be measured according to the following measuring method.

First, particles are dispersed on a steel plate having a flat surface, one particle is selected from the particles, and thereafter the one fine particle is compressed by the use of a micro compression tester with a flat end face of a diamond column of 50 μm in diameter. At this time, a compressive load is electrically detected as electromagnetic force, and a compression displacement is electrically detected as displacement by an operating transformer. Then, the load value and compression displacement at 10% compressive deformation are found based on the relationship between the obtained compression displacement and load, and the K value is calculated from the obtained results.

The preferable lower limit of a compression recovery rate when the spacer particles are released from the compressive deformation state at 20° C. and 10% is 20%. In the case where the spacer particles having such a compression recovery rate are used, even when particles larger than the average particle diameter exist between the laminated chips, the spacer particles can function as a gap-adjusting agent by performing compressive deformation and thereby recovering the shape. Therefore, it is possible to horizontally laminate chips with a more stable, regular interval.

The compression recovery rate can be measured according to the following measuring method.

A compression displacement is electrically detected as displacement by an operating transformer in the same manner as in the measurement of the K value. After compression to obtain a reverse load value, a load is reduced. At this point, the relationship between the obtained load and compression displacement is measured. A compression recovery rate is calculated from the obtained measurement results. In this calculation, the end point upon removing the load is set to an origin load value of 0.1 g or more, not a load value of zero.

Although not particularly limited thereto, the material of the spacer particles are preferably resin particles. The resins forming the resin particles are not particularly limited, and examples thereof include polyethylene, polypropylene, polymethylpentene, polyvinyl chloride, polytetrafluoroethylene, polystyrene, polymethylmethacrylate, polyethylene terephthalate, polybutylene terephthalate, polyamide, polyimide, polysulfone, polyphenylene oxide, polyacetal, and the like. Since the hardness and recovery rate of spacer particles are more likely to be adjusted and the heat resistance also can be improved, it is preferable to use crosslinked resins among others.

The crosslinked resins are not particularly limited, and examples thereof include resins having a network structure such as an epoxy resin, a phenol resin, a melamine resin, an unsaturated polyester resin, a divinylbenzene polymer, a divinylbenzene-styrene copolymer, a divinylbenzene-acrylic ester copolymer, a diallyl phthalate polymer, a triallyl isocyanurate polymer, and a benzoguanamine polymer. Among others, the divinylbenzene polymer, the divinylbenzene-styrene copolymer, a divinylbenzene (meta)acrylic ester copolymer, the diallyl phthalate polymer, and the like are preferable.

Upon use of these resins, heat resistance in heat treatment processes such as a curing process and a solder reflowing process is excellent after bonding chips.

The spacer particles are preferably subjected to a surface treatment as needed.

It is possible to realize the above-mentioned viscosity characteristics in the adhesive for electronic parts of the present invention by carrying out a surface treatment on the spacer particles.

The method for carrying out the surface treatment is not particularly limited, and when an adhesive composition exhibits hydrophobicity in its entirety, for example, it is preferable to impart a hydrophilic group to the surface thereof. The means are not particularly limited, and examples thereof include: a method for processing the surface of the resin particles with a coupling agent having a hydrophilic group upon use of the resin particles as spacer particles; and the like.

The shape of the spacer particles is preferably spherical. In addition, the preferable upper limit of an aspect ratio of the spacer particles is 1.1. The aspect ratio of 1.1 or less makes it possible to keep the interval between semiconductor chips constant in a stable manner upon lamination of the semiconductor chips. Moreover, the aspect ratio as used herein refers to a ratio of a major axis to a minor axis of a particle (value obtainable by dividing a longer diameter by a shorter diameter). As this aspect ratio comes close to 1, the shape of the spacer particle approaches a perfect sphere.

The preferable lower limit of a blending amount of the spacer particles is 0.01% by weight, and the preferable upper limit thereof is 5% by weight. When it is less than 0.01% by weight, the interval of semiconductor chips may fail to be kept constant in a stable manner upon producing a semiconductor chip laminated body; while when it exceeds 5% by weight, the function as an adhesive may be deteriorated.

Further, in the case where the solid component having a diameter larger than the average particle diameter of the spacer particles are contained in addition to the spacer particles, the preferable upper limit of a blending amount of such a solid component is 1% by weight. Moreover, the melting point of the solid component is preferably a curing temperature or lower.

Furthermore, the maximum particle diameter of the solid component is preferably 1.1 to 1.5 times as large as the average particle diameter of spacer particles, and more preferably 1.1 to 1.2 times.

The adhesive for electronic parts of the present invention preferably further contains a curing accelerator in order to adjust a curing speed, physical properties of the cured material, and the like.

The curing accelerator is not particularly limited, and imidazole type curing accelerators and tertiary amine type curing accelerators and the like can be exemplified, and the imidazole type curing accelerators are preferably used among them since it facilitates control of the reaction system for adjusting the curing speed and physical properties of the cured material. These curing accelerators may be used independently, or two or more kinds may be used in combination.

The imidazole type curing accelerator is not particularly limited, and examples thereof include: 1-cyanoethyl-2-phenylimidazole of which the 1-site of the imidazole is protected with a cyanoethyl group; "2MA-OK" (trade name, produced by Shikoku Chemicals Corporation) in which the basicity is protected with isocyanuric acid; and the like. These imidazole type curing accelerators may be used independently, or two or more kinds may be used in combination.

A blending amount of the curing accelerator is not particularly limited, and the preferable lower limit thereof is 1 part by weight and the preferable upper limit thereof is 20 parts by weight, with respect to the total of 100 parts by weight of the curing compound such as the epoxy compound contained in the adhesive for electronic parts of the present invention. When it is less than 1 part by weight, the adhesive for electronic parts of the present invention may not be sufficiently cured; meanwhile, when it exceeds 20 parts by weight, the adhesion reliability of the adhesive for electronic parts of the present invention may be lowered.

The adhesive for electronic parts of the present invention preferably further contains a thixotropy providing agent. By containing the thixotropy providing agent, it is possible to achieve the desired viscosity behavior in the adhesive for electronic parts of the present invention.

The thixotropy providing agent is not particularly limited, and examples thereof include inorganic fine particles such as metal fine particles, calcium carbonate, fumed silica, aluminum oxide, boron nitride, aluminum nitride, aluminum borate, and the like. Fumed silica is preferable among others.

Utilizable as the thixotropy providing agent is an agent that undergoes a surface treatment if needed, and it is preferable to use particles having a hydrophobic group especially on the surface thereof. Specifically, it is preferable to use the fumed silica whose surface is hydrophobized.

In the case of using a particulate agent as the thixotropy providing agent, the preferable upper limit of an average particle diameter is 1 µm. When it exceeds 1 µm, the desired thixotropy property may not be exerted.

A blending amount of the thixotropy providing agent is not particularly limited, and in the case where the surface treatment is not performed on the spacer particles, the preferable lower limit thereof is 0.5% by weight, and the preferable upper limit thereof is 20% by weight. When it is less than 0.5% by weight, a sufficient thixotropy property may not be obtained, and when it exceeds 20% by weight, the degree of excluding the adhesive for electronic parts may be lowered upon lamination of semiconductor chips. The more preferable lower limit thereof is 1% by weight, and the more preferable upper limit thereof is 10% by weight.

The adhesive for electronic parts of the present invention may contain a solvent if needed.

The solvent is not particularly limited, and examples thereof include aromatic hydrocarbons, chlorinated aromatic hydrocarbons, chlorinated aliphatic hydrocarbons, alcohols, esters, ethers, ketones, glycol ethers (cellosolves), alicyclic hydrocarbons, aliphatic hydrocarbons, and the like.

The adhesive for electronic parts of the present invention may contain an inorganic ion exchanger if needed. There may be mentioned IXE series (produced by Toagosei Co., Ltd.) and the like as an example of a commercial product of the inorganic ion exchanger. The preferable lower limit of a blending amount of the inorganic ion exchanger is 1% by weight, and the preferable upper limit thereof is 10% by weight.

The adhesive for electronic parts of the present invention may contain additives such as adhesion providing agents including a bleed inhibitor and an imidazole silane coupling agent, if needed in addition to the above-mentioned substances.

The adhesive for electronic parts of the present invention preferably contains: particles comprising a polyfunctional acid anhydride type curing agent in a solid state at normal temperature; and a curing accelerator.

Containing the polyfunctional acid anhydride type curing agent in a solid state at normal temperature involves dissolving a curing agent upon heating at the time of adhesion and the resultant viscosity reduction, and the desired distance between gaps is more likely to be achieved. In addition, being polyfunctional results in excellent heat resistance after curing.

The polyfunctional acid anhydride type curing agent in a solid state at normal temperature is not particularly limited, examples of a trifunctional acid anhydride curing agent include trimellitic anhydride, and the like, and examples of a tetra-or-more functional acid anhydride curing agent include pyromellitic anhydride, benzophenone tetracarboxylic anhydride, methylcyclohexene tetracarboxylic acid anhydride, polyazelaic acid anhydride, and the like.

The preferable lower limit of a melting point of the particles comprising a polyfunctional acid anhydride type curing agent in a solid state at normal temperature is 80° C.

In addition, with respect to an average particle diameter of the particles comprising a polyfunctional acid anhydride type curing agent in a solid state at normal temperature, the preferable lower limit thereof is 0.1 µm, and the preferable upper limit thereof is 10 µm.

Moreover, the adhesive for electronic parts of the present invention preferably contains: particles including a polyfunctional acid anhydride type curing agent in a solid state at normal temperature; and a bifunctional acid anhydride type curing agent in a liquid state at normal temperature.

Since the heat resistance of the entire curing material is improved by containing a bifunctional acid anhydride type curing agent in a liquid state at normal temperature, that is preferable.

Examples of the particles comprising the polyfunctional acid anhydride type curing agent in a solid state at normal temperature include the same substances as the above-mentioned ones.

The bifunctional acid anhydride type curing agent in a liquid state at normal temperature is not particularly limited, and examples thereof include phthalic anhydride, hexahydrophthalic anhydride, methyltetrahydrophthalic anhydride, methylhexahydrophthalic anhydride, endomethylenetetrahydrophthalic anhydride, methylendomethylenetetrahydrophthalic anhydride, maleic anhydride, and the like.

Moreover, the adhesive for electronic parts of the present invention may further contain the above-described curing accelerator in the case where the adhesive contains: particles including a acid anhydride type curing agent in a solid state at normal temperature; and a bifunctional acid anhydride type curing agent in a liquid state at normal temperature.

As a combination of the particles including a polyfunctional acid anhydride type curing agent in a solid state at normal temperature and the bifunctional acid anhydride type curing agent in a liquid state at normal temperature, there may be mentioned a combination of: one or more kinds selected from the group consisting of pyromellitic anhydride, benzophenone tetracarboxylic anhydride, and methylcyclohexene tetracarboxylic acid anhydride; and one or more kinds selected from the group consisting of methyltetrahydrophthalic anhydride, methylhexahydrophthalic anhydride, endomethylenetetrahydrophthalic anhydride, and methylendomethylenetetrahydrophthalic anhydride.

Blending amounts of the particles including a polyfunctional acid anhydride type curing agent in a solid state at normal temperature and the bifunctional acid anhydride type curing agent in a liquid state at normal temperature are not particularly limited. With respect to the value obtained by dividing the amount of functional groups of the curing compound by the total amount of basic groups of the curing agent, the preferable lower limit thereof is 0.5, and the preferable upper limit thereof is 1.5. The value of less than 0.5 may deteriorate adhesion reliability of the adhesive for electronic parts of the present invention, and the value exceeding 1.5 may cause insufficient curing of the adhesive for electronic parts of the present invention. In addition, for example, the mere use of the particles including a tri- or more-functional acid anhydride curing agent in a solid state at normal temperature may cause insufficient heat resistance of a cured material. The more preferable lower limit thereof is 0.6, and the more preferable upper limit thereof is 1.3.

In the adhesive for electronic parts of the present invention containing the particles including a polyfunctional acid anhydride type curing agent in a solid state at normal temperature and the bifunctional acid anhydride type curing agent in a liquid state at normal temperature, a blending ratio of the particles including a polyfunctional acid anhydride type curing agent in a solid state at normal temperature to the bifunctional acid anhydride type curing agent in a liquid state at normal temperature is not particularly limited. With respect to the value obtained by dividing the blending amount (weight) of the particles including a polyfunctional acid anhydride type curing agent in a solid state at normal temperature by the blending amount (weight) of the bifunctional acid anhydride type curing agent in a liquid state at normal temperature, the preferable lower limit thereof is 0.1, and the preferable upper limit thereof is 10. The value of less than 0.1 may cause insufficient heat resistance of the cured material, and the value exceeding 10 may cause insufficient strength of the entire cured material. The more preferable lower limit thereof is 0.2, and the more preferable upper limit thereof is 5.

A reaction rate after leaving standing the adhesive for electronic parts of the present invention for 10 minutes at 20 to 120° C. is preferably less than 5%. When it is 5% or more, the adhesive may fail to reach the target spacers upon die bonding.

The adhesive for electronic parts of the present invention preferably has a cure shrinkage of less than 1% upon curing. When the cure shrinkage upon curing is 1% or more, an internal stress generated upon curing may cause peeling between layers upon producing a semiconductor chip laminated body.

The cure shrinkage as used herein denotes the value that can be calculated as a volume shrinkage rate (%) from the difference in specific gravity before and after curing in conformity with JIS A06024. In this case, the specific gravity is measured at a measurement temperature of 25° C.

When 0.2 mg of the adhesive for electronic parts of the present invention is applied to the mirror surface of a silicon wafer to form a circular adhesive layer having a diameter of 500 µm, and the adhesive layer is cured at 170° C. for 10 minutes to obtain a cured material, a bleed distance of the liquid component that bleeds from this cured material is preferably less than 5 µm. When the bleed distance of the liquid component is 5 µm or more, it is possible to sufficiently prevent what is called a bleeding phenomenon in which a liquid component of the adhesive bleeds out, upon joining electronic parts by using the adhesive for electronic parts of the present invention, and to obtain reliable electronic parts, and consequently to sufficiently meet the demands for recent miniaturization of electronic parts and higher levels of integration. The preferable upper limit of the bleed distance is 3 µm, and the more preferable upper limit thereof is 1 µm.

The liquid component as used herein means a component in a liquid state at 25° C. The adhesive for electronic parts of the present invention preferably contains a curing compound and a curing agent as the liquid component, and more preferably contains a curing accelerator.

In addition, the bleed distance refers to the length, in a central direction, of a portion of different colors present around the adhesive cured material, when an adhesive cured material is observed with an optical microscope.

In the following description, the property in which the bleed distance of the liquid component from the cured material of the adhesive for electronic parts of the present invention fulfills the above-mentioned conditions is also called "low bleeding property".

The low bleeding property of the adhesive for electronic parts of the present invention can be favorably achieved by two or more kinds of inorganic fine particles each of which has a totally different hydrophilicity (hydrophobicity) functioning as a thickener, and one kind of which has a hydrophilicity (hydrophobicity) relatively close to a hydrophilicity (hydrophobicity) of the liquid component contained in the adhesive and the other kind of which has a hydrophilicity (hydrophobicity) relatively far from the hydrophilicity (hydrophobicity) of the liquid component contained in the adhesive. Further, the adhesive for electronic parts of the present invention can realize suitable thixotropy as an adhesive by containing such inorganic fine particles.

In the adhesive for electronic parts of the present invention containing two or more kinds of inorganic fine particles whose hydrophilicities (hydrophobicities) are totally different from each other, the inorganic fine particles close to the hydrophilicity (hydrophobicity) of the liquid component presumably play a role in preventing bleeding of the liquid component from the adhesive layer comprising the adhesive for electronic parts of the present invention. Moreover, inorganic fine particles far from the hydrophilicity (hydrophobicity) of the liquid component supposedly forms a linear continuum in the adhesive layer comprising the adhesive for electronic parts of the present invention, and conceivably plays a part in realizing the thixotropy.

Here, a solubility parameter (SP value) is used as an index indicating the hydrophilicity of the liquid component, and the SP value of approximately 8 to 14 are usually needed as an SP value of the liquid component of the adhesive used for adhering two or more electronic parts. In contrast, a hydrophobic degree (M value) is used as an index indicating the hydrophilicity of fillers such as the inorganic fine particles.

It is impossible to directly convert the SP value (an index indicating the hydrophilicity of the liquid component) into the M value (an index indicating the hydrophilicity of the inorganic fine particles), and vice versa.

However, the present inventors' researches suggest that the SP values of the liquid component of 8 to 11 and the M values of the inorganic fine particles of 50 or less virtually correspond to relatively close hydrophilicities (hydrophobicities), and the SP values of the liquid component of 11 to 14 and the M values of the inorganic fine particles of 40 or less virtually correspond to relatively close hydrophilicities (hydrophobicities).

Then, the SP values of the liquid component in the adhesive for electronic parts of the present invention are preferably divided into the range of 8 to 11 and the range of 11 to 14, and the adhesive preferably contains two or more inorganic fine particles having the optimal hydrophilicity (hydrophobicity) virtually corresponding to the SP values in the respective ranges.

The method for adjusting the SP value of the liquid component within a predetermined range is not particularly limited, and examples thereof include: a method of appropriately selecting and using the curing compound, the curing agent, etc. based on the SP values of each of these; and the like.

More specifically, the adhesive for electronic parts of the present invention preferably contains: inorganic fine particles (A) having the upper limit of an average primary particle diameter of 50 nm and the upper limit of a hydrophobic degree (M value) of 50; and inorganic fine particles (B) having the upper limit of an average primary particle diameter of 50 nm and the lower limit of a hydrophobic degree (M value) of 60, provided that an SP value of the liquid component (hereinafter, also referred to a liquid component (1)) is 8 to 11. In the adhesive for electronic parts of the present invention having such a composition, the inorganic fine particles (A) plays a role in achieving the low bleeding property to the liquid component (1), and the inorganic fine particles (B) plays a part in imparting thixotropy suitable for application.

Specific examples of a method for preparing the liquid component (1) having the lower limit of the SP value of 8 and the upper limit thereof of 11 include: a method for using a dicyclopentadiene type epoxy resin, a butadiene modified epoxy resin, a silicone modified epoxy resin, etc.; and the like.

The upper limit of an average primary particle diameter of the inorganic fine particles (A) and the inorganic fine particles (B) is 50 nm. The average primary particle diameter exceeding 50 nm may make the thixotropy insufficient, cause an inferior application property, and lead to failure to obtain a sufficient low bleeding property. The preferable upper limit thereof is 40 nm, and the more preferable upper limit thereof is 30 nm.

Here, in the present description, the average primary particle diameter refers to a particle diameter before coagulation of inorganic particles, and means a value measured by virtue of the laser particle size distribution meter after dispersion with ultrasonic waves, etc. in a favorable dispersing solvent.

The upper limit of an M value of the inorganic fine particles (A) is 50, and the lower limit of an M value of the inorganic fine particles (B) is 60. The M value of the inorganic fine particles (A) exceeding 50 may make the low bleeding property insufficient, and the M value of the inorganic fine particles (B) of less than 60 may make the thixotropy insufficient and cause an inferior application property.

Here, in the present description, the M value of inorganic fine particles refers to a methanol concentration measured upon complete swelling of the inorganic fine particles after dripping methanol into water containing the inorganic fine particles.

Here, the method for adjusting the M values of the inorganic fine particles (A) and the inorganic fine particles (B) to the aforementioned range is not particularly limited, and examples thereof include: a method for carrying out a surface treatment on the inorganic fine particles and changing the number of hydrophilic groups present on the surface thereof, a method for carrying out a surface treatment on the inorganic fine particles and changing the number of hydrophobic groups present on the surface thereof; and the like.

As the method for adjusting the hydrophilicity (hydrophobicity) of the silica fine particles according to the surface treatment method in the case of selecting silica fine particles as the inorganic fine particles, there may be mentioned a preferable method for modifying the surface of the untreated silica fine particles with —$CH_3$ and adjusting a carbon content to obtain silica fine particles (E) whose upper limit of the M value is 50 and silica fine particles (F) whose lower limit of the M value is 60.

Specific examples of such silica fine particles (E) whose carbon content is adjusted include MT-10 (0.9), DM-10 (0.9) (all produced by TOKUYAMA Corp.), and the like. Moreover, specific examples of such silica fine particles (F) whose carbon content is adjusted include PM-20L (5.5), HM-30S (3.5) (all produced by TOKUYAMA Corp.), and the like.

Here, the numerical value indicated in the parenthesis after each of the product names denotes a carbon content (% by weight).

Specific examples of the inorganic fine particles (A) whose upper limit of the M value is 50 include DM-10 (48), MT-10 (47) (all produced by TOKUYAMA Corp.), R-972 (48) (produced by Degussa Corporation), and the like. Here, the numerical value indicated in the parenthesis after each of the product names denotes an M value.

Specific examples of the inorganic fine particles (B) whose lower limit of the M value is 60 include ZD-30ST (62), HM-20L (64), PM-20L (65) (all produced by TOKUYAMA Corp.), RX-200 (64), R202 (65) (all produced by Degussa Corporation), and the like. Here, the numerical value indicated in the parenthesis after each of the product names denotes an M value.

With respect to a total content of the inorganic fine particles (A) and the inorganic fine particles (B), the preferable lower limit thereof is 2 parts by weight and the preferable upper limit thereof is 10 parts by weight, with respect to the total of 100 parts by weight of the curing compound contained in the adhesive for electronic parts of the present invention. When it is less than 2 parts by weight, the low bleeding property and thixotropy may be insufficient; whereas when it exceeds 10 parts by weight, the adhesion of the adhesive for electronic parts of the present invention may be lowered. The more preferable lower limit thereof is 4 parts by weight, and the more preferable upper limit thereof is 8 parts by weight.

With respect to a blending ratio of the inorganic fine particles (B) to the inorganic fine particles (A), the preferable lower limit of the inorganic fine particles (B) is 30 parts by weight and the preferable upper limit thereof is 600 parts by weight, with respect to 100 parts by weight of the inorganic fine particles (A). When it is less than 30 parts by weight, the thixotropy may be insufficient, likely leading to an inferior application property. When it exceeds 600 parts by weight, the low bleeding property may be insufficient. The more preferable lower limit thereof is 50 parts by weight, and the more preferable upper limit thereof is 500 parts by weight.

More specifically, the adhesive for electronic parts of the present invention preferably contains: inorganic fine particles (C) having the upper limit of an average primary particle diameter is 50 nm and the upper limit of a hydrophobic degree (M value) is 40; and inorganic fine particles (D) having the upper limit of an average primary particle diameter of 50 nm and the lower limit of a hydrophobic degree (M value) of 50, provided that an SP value of the liquid component (hereinafter, also referred to as a liquid component (2)) is 11 to 14. In the adhesive for electronic parts of the present invention having such a composition, the inorganic fine particles (C) plays a role in achieving the low bleeding property and the inorganic fine particles (D) plays a part in imparting thixotropy suitable for application, to the liquid component (2).

Specific example of a method for preparing the liquid component (2) having the lower limit of the SP value of 11 and the upper limit thereof of 14 include: a method for using a resorcinol type epoxy resin, a naphthalene type epoxy resin, a propylene glycol modified epoxy resin; and the like.

The upper limit of an average primary particle diameter of the inorganic fine particles (C) and the inorganic fine particles (D) is 50 nm. The average primary particle diameter exceeding 50 nm may make the thixotropy insufficient, cause an inferior application property, and lead to failure to obtain a sufficient low bleeding property. The preferable upper limit thereof is 40 nm, and a the more preferable upper limit thereof is 30 nm.

The upper limit of an M value of the inorganic fine particles (C) is 40, and the lower limit of an M value of the inorganic fine particles (D) is 50. The M value of the inorganic fine particles (C) exceeding 40 may make the low bleeding property insufficient, and the M value of the inorganic fine particles (D) of less than 50 may make the thixotropy insufficient and cause an inferior application property.

Here, the method for adjusting the M value of the inorganic fine particles (C) and the inorganic fine particles (D) to the aforementioned range is not particularly limited, and one such example is the same method as in the above-mentioned inorganic fine particles (A) and inorganic fine particles (B).

As the method for adjusting the hydrophilicity (hydrophobicity) of the silica fine particles according to the surface treatment method in the case of selecting silica fine particles as the inorganic fine particles, there may be mentioned a preferable method for modifying the surface of the untreated silica fine particles with —$CH_3$ and adjusting a carbon content to obtain silica fine particles (G) whose upper limit of the M value is 40 and silica fine particles (H) whose lower limit of the M value is 50.

Specific examples of such silica fine particles (G) whose carbon content is adjusted include QS-40 (0) (produced by TOKUYAMA Corp.), and the like. Moreover, specific examples of such silica fine particles (H) whose carbon content is adjusted include DM-30 (1.7), KS-20S (2.0) (all produced by TOKUYAMA Corp.), and the like. Here, the numerical value indicated in the parenthesis after the product name denotes a carbon content (% by weight).

Specific examples of the inorganic fine particles (C) whose upper limit of the M value is 40 include QS-40 (0) (produced by TOKUYAMA Corp.), and the like. Here, the numerical value indicated in the parenthesis after the product name denotes an M value.

Specific examples of the inorganic fine particles (D) whose lower limit of the M value is 50 include DM-30 (52), KS-20S (56) (all produced by TOKUYAMA Corp.), R-976 (52) (produced by Degussa Corporation), and the like. Here, the numerical value indicated in the parenthesis after each of the product names denotes an M value.

With respect to a total content of the inorganic fine particles (C) and the inorganic fine particles (D), the preferable lower limit thereof is 2 parts by weight and the preferable upper limit thereof is 10 parts by weight, with respect to the total of 100 parts by weight of the curing compound contained in the adhesive for electronic parts of the present invention. When it is less than 2 parts by weight, the low bleeding property and the thixotropy may be insufficient; whereas when it exceeds 10 parts by weight, the adhesion of the adhesive for electronic parts of the present invention may be lowered. The more preferable lower limit thereof is 4 parts by weight, and the more preferable upper limit thereof is 8 parts by weight.

With respect to a blending ratio of the inorganic fine particles (D) to the inorganic fine particles (C), the preferable lower limit of the inorganic fine particles (D) is 30 parts by weight and the preferable upper limit thereof is 600 parts by weight, with respect to 100 parts by weight of the inorganic fine particles (C). When it is less than 30 parts by weight, the thixotropy may be insufficient, likely leading to an inferior application property. When it exceeds 600 parts by weight, the low bleeding property may be insufficient. The more preferable lower limit thereof is 50 parts by weight, and the more preferable upper limit thereof is 400 parts by weight.

For example, it is possible to produce the adhesive composition for electronic parts of the present invention by the method for blending and mixing, as needed, a predetermined amount of a curing accelerator, a polymer compound having a functional group reactable with a curing compound, a thixotropy providing agent, other additives, etc. into the adhesive composition having a curing compound and a curing agent and thereafter blending spacer particles into the obtained mixture.

The mixing method is not particularly limited, and one such example is a method of using a homodisper, a universal mixer, a Banbury mixer, a kneader, and the like.

The electronic parts joined with the adhesive for electronic parts of the present invention are not particularly limited, and include a semiconductor chip, a sensor, and the like. Moreover, the electronic parts are also used for forming a coil iron core gap for transformer parts, and preferable examples thereof include EI type and EE type.

It is possible to produce a semiconductor device by laminating two or more semiconductor chips in multiple layers by the use of the adhesive for electronic parts of the present invention and then sealing the obtained semiconductor chips with a sealing material, etc. Such a semiconductor device is also one aspect of the present invention. The adhesive for electronic parts of the present invention can be especially favorably used upon laminating a semiconductor chip in a crisscross manner.

In addition, the adhesive for electronic parts of the present invention can be favorably used also as an adhesive not only for laminating two or more semiconductor chips but also for loading a semiconductor chip on a substrate and joining parts such as a sensor.

By using the adhesive for electronic parts of the present invention, two or more semiconductor chips can be laminated to produce a semiconductor chip laminated body. In the producing method thereof, two or more semiconductor chips are laminated by interposing an adhesive for electronic parts, the method comprising: an application step (1) of applying the adhesive for electronic parts to one semiconductor chip; a semiconductor chip laminating step (2) of laminating another semiconductor chip by interposing an adhesive for electronic parts applied to the one semiconductor chip; a curing step (3) of curing an adhesive for electronic parts between the one semiconductor chip and the other semiconductor chip, in the application step (1), the adhesive for electronic parts being applied to an outer peripheral part and a central part of a region of the one semiconductor chip on which the other semiconductor chip is laminated, and an application amount of the adhesive for electronic parts to the outer peripheral part being 2 to 5 times as much as an application amount of the adhesive to a central part. The method for producing such a semiconductor chip laminated body is also one aspect of the present invention.

Semiconductor chips to be laminated by using the adhesive for electronic parts of the present invention are not particularly limited, and can be used as various semiconductor chips.

Since the adhesive for electronic parts of the present invention exhibits the above-mentioned viscosity behavior, it is favorably used in the case of laminating a wire bonding type semiconductor chip, for example. As illustrated in FIG. 1, the adhesive for electronic parts of the present invention is favorably used especially in the case of embedding a wire 6 by using the adhesive 1 for electronic parts of the present invention, and then laminating semiconductor chips 3 and 4 arranged on the substrate 5 by interposing spacer particles 2. Here, FIG. 1 is a cross-sectional view schematically illustrating an example of semiconductor chips laminated by using an adhesive for electronic parts of the present invention.

The adhesive or electronic parts of the present invention is preferable in that upon use thereof, the above-mentioned viscosity behavior prevents spacer particles from flowing into a connection electrode portion for wire bonding and thereby obviates possible defects such that spacer particles may come into contact with a wire. This is because as the distance between semiconductor chips approaches the particle diameter of spacer particles in the process of laminating a semiconductor chip, the spacer particles are less likely to move owing to the above-mentioned viscosity behavior, and the spacer particles cease to flow into the connection electrode portion for wire bonding.

Moreover, semiconductor chips to be laminated may be of the same shape or different shapes.

It is also possible to arrange two or more semiconductor chips having different thicknesses so as to adjoin one another, and to laminate semiconductor chips, which have a size large enough to enclose all of these two or more semiconductor chips, on the aforementioned two or more semiconductor chips. In such a case, it is preferable to appropriately use a plurality of adhesives having spacer particles different in their particle diameters according to the distance between chips.

Further, upon arranging two or more semiconductor chips having different thicknesses on one substrate so as to adjoin one another, it is possible to appropriately use a plurality of adhesives having spacer particles different in their particle diameters according to the thickness of the semiconductor chips, adjust the upper surfaces of semiconductor chips having different thicknesses so as to have the same height, and laminate semiconductor chips, which have a size large enough to enclose all of these semiconductor chips, on the aforementioned semiconductor chips.

In the method of producing the semiconductor chip laminated body of the present invention, the application step (1) of applying the adhesive for electronic parts to the one semiconductor chip is first performed.

In the application step (1), the adhesive for electronic parts is applied to the outer peripheral part and the central part of the area where the other semiconductor chip is laminated on the one semiconductor chip. The adhesion of semiconductor chips is improved by applying the adhesive for electronic parts to such an area.

In the application step (1), the application amount of the adhesive for electronic parts to the outer peripheral part is set to 2 to 5 times as large as the application amount to the central part. Thus, by setting the application amount to the outer peripheral part larger than the application amount to the central part, it is possible in the semiconductor chip laminating step (2) as described later to uniformly disperse the adhesive for electronic parts over a joining part upon positioning and then pressurizing the semiconductor chips, with the result that the semiconductor chip laminated body to be obtained will have high reliability. Since pressure and time are needed for achieving the desired distance between chips when the application amount to the outer peripheral part is less than 2 times as large as the application amount to the central part, productivity will be reduced. When it exceeds 5 times, voids will be entrained. The application amount of 3 to 4 times is preferable.

Here, the outer peripheral part refers to an area surrounded by the inner periphery and the outer periphery, provided that the set of points each located at a distance 0.7 to 0.9 times as large as the distance from the center of gravity of the area, where the other semiconductor chip is laminated on the one semiconductor chip, to the outer periphery is defined as the inner periphery. Moreover, the central part refers to an area surrounded by the innermost periphery, provided that the set of points each located at a distance 0.7 to 0.9 times as large as the distance from the center of gravity to the outer periphery as described above and also located inside the inner periphery is defined as the innermost periphery.

The application method in the application step (1) is not particularly limited, and examples thereof include: an application method with the concomitant use of a syringe provided with a precision nozzle, etc. and a dispenser, etc.; and the like.

In the application step (1), the height upon applying the adhesive for electronic parts is not particularly limited, and preferably 2 to 10 times as large as the desired distance between chips. Especially when the desired distance between chips is 50 μm or less and/or an area of the main surface of a semiconductor chip is 80 mm$^2$ or more, the preferable upper limit of the height to be applied is 300 μm, and the more preferable upper limit thereof is 200 μm.

In the method of producing the semiconductor chip laminated body of the present invention, subsequently, the semiconductor chip laminating step (2) of laminating another semiconductor chip by interposing an adhesive for electronic parts applied to the one semiconductor chip is conducted. In the semiconductor chip laminating step (2), the semiconductor chips are laminated by positioning the semiconductor chips with the adhesive for electronic parts interposed therebetween.

It is preferable to press against the other semiconductor chip laminated on the one semiconductor chip in the semiconductor chip laminating step (2). By pressing as described above, it is possible to laminate semiconductor chips in such a manner that an excess adhesive for electronic parts is sufficiently discharged and the interval between the semiconductor chips is maintained by spacer particles.

The pressing is preferably carried out for 0.1 to 5 seconds at a pressure of 0.01 to 0.5 MPa. When it is less than 0.01 MPa or less than 0.1 second, the effects exerted by pressing may be insufficient. When the pressure is applied in excess of 0.5 MPa or for more than 5 seconds, it may be difficult to produce a semiconductor chip laminated body with sufficient productivity. The pressing is more preferably carried out at a pressure of 0.05 to 0.2 MPa.

In the semiconductor chip laminating step (2), it is preferable to reduce the distance between chips to a distance 1 to 1.2 times as large as the desired distance between chips by performing the pressing. At this time, in the case where the distance between chips is larger than the particle diameter of each spacer particle, it is preferable in the curing step (3) as described later to make the distance between chips substantially the same as the particle diameter of each spacer particle by allowing the adhesive for electronic parts to flow.

In the method of producing the semiconductor chip laminated body of the present invention, subsequently, the curing step (3) of curing an adhesive for electronic parts between the one semiconductor chip and the other semiconductor chip is conducted. A semiconductor chip laminated body can be obtained by curing the adhesive for electronic parts. Here, the curing step may be performed every time one semiconductor chip is laminated, or may be carried out at once after repeating lamination of a semiconductor chip the desired number of times.

The curing method is not particularly limited, and it is possible to appropriately select and use curing conditions according to curing characteristics of the adhesive for electronic parts. In order to prevent entrainment of voids and improve the distance accuracy between chips, it is preferable to precure an adhesive for electronic parts for 10 minutes to 2 hours at 70 to 120° C., at which curing does not start virtually, and thereafter cure the adhesive at 120 to 200° C.

The distance variation between chips of the semiconductor chip laminated body to be obtained after the curing step (3) is preferably less than 5 μm at 3 σ. When the variation is 5 μm or more at 3 σ, poor wire bonding and poor flipchip bonding may occur. Here, σ denotes a standard deviation.

Effects of the Invention

According to the present invention, it is possible to provide: an adhesive for electronic parts that makes it possible to accurately maintain a distance between electronic parts upon joining the electronic parts such as two or more semiconductor chips and also to obtain reliable electronic parts such as a semiconductor device; a method for producing a semiconductor chip laminated body using the adhesive for electronic parts; and a semiconductor device using the adhesive for electronic parts.

BEST MODE FOR CARRYING OUT THE INVENTION

The following will discuss the present invention in further detail by way of Examples, and the present invention is not limited to these Examples. Here, a particle-size measuring apparatus (Coulter Counter ZB/C-1000, produced by Coulter Electronics) was used for measuring particle sizes described in Examples and Comparative Examples, and a microhardness tester (Fischerscope H100C, produced by Fischer Instruments K.K.), for measuring K values and compression recovery rates described therein.

Examples 1 and 2, Comparative Examples 1 to 3, and Reference Example 1

(1) Production of Adhesive for Electronic Parts

Based on the composition of Table 1, the materials other than the below-mentioned spacer particles were mixed under stirring by using a homodisper to produce an adhesive composition. Spacer particles were blended in the resultant adhesive composition based on the composition of Table 1 and further mixed under stirring by using a homodisper to produce an adhesive for electronic parts.

(Curing Compound)

Dicyclopentadiene type epoxy resin (HP-7200HH, produced by DIC Corporation)

Naphthalene type epoxy resin (HP-4032D, produced by DIC Corporation, liquid state at normal temperature)

Fluorene type epoxy resin (EX1020, produced by Nagase & Co., Ltd., melting point: 30° C.)

Low-viscosity epoxy resin (EP-4088S, produced by ADEKA Corporation, viscosity: 250 mPa·s/25° C.)

(Curing Agent)

Acid anhydride (YH-307, produced by Japan Epoxy Resins Co., Ltd.)

(Curing Accelerator)

Imidazole compound (2MA-OK, produced by Shikoku Chemical's Corporation)

(Thixotropy Providing Agent)

Fumed silica (AEROSIL R202S, produced by NIPPON AEROSIL Co., Ltd.)

(Polymer Compound Having Epoxy Group)

Epoxy group-containing acrylic resin (BLEMMER CP-30, produced by Japan Epoxy Resins Co., Ltd.)

(Rubber Modified Epoxy Resin)
CTBN modified epoxy resin (EPR-4023, produced by ADEKA Corporation)
(Spacer Particles)
Resin particles (Micropearl SP-210, produced by Sekisui Chemical Co., Ltd., average particle diameter: 10 μm, CV value: 4%)
Spherical silica (S430-2, produced by Micron Technology, Inc., average particle diameter: 8.4 μm, CV value>10%)

(2) Production of Semiconductor Chip Laminated Body

The obtained adhesive for electronic parts was filled into a 10 mL syringe (produced by Iwashita Engineering, Inc.), a precision nozzle (produced by Iwashita Engineering, Inc., nozzle tip diameter: 0.3 mm) was attached to the tip of the syringe, and the adhesive was applied to a glass substrate in an application amount of 5 mg at a discharge pressure of 0.4 MPa by using a dispenser device (SHOT MASTER300, produced by Musashi Engineering, Inc.), with a gap between a semiconductor chip and a needle being set to 200 μm. With respect to the application amount, (application amount to the outer peripheral portion of the joining part/application amount to the central portion) was set to 4.

After the application, a semiconductor chip (chip 1) (thickness: 80 μm, 8 mm×12 mm, mesh-like pattern, aluminum wiring: thickness: 0.7 μm, L/S=15/15, thickness of a silicon nitride film on the surface thereof: 1.0 μm) having 172 pieces of 110 μm pad openings in peripheral shape was pressed at a pressure of 0.15 MPa for 5 seconds by using a flip chip bonder (DB-100, produced by Shibuya Kogyo Co., Ltd.), and thereby laminated. Subsequently, the adhesive for electronic parts was applied to the chip 1 by using the above-mentioned dispenser device, a semiconductor chip (chip 2) identical to the chip 1 was placed on the chip 1 in such a manner that the longer sides of the chip 1 cross the longer sides of the chip 2, and the chip 2 was pressed at a pressure of 0.15 MPa at a temperature of 25° C. for 5 seconds, and thereby laminated. Then, after the resultant product was left standing in a hot air blow drying furnace at 80° C. for 60 minutes, heating was performed thereon at 150° C. for 60 minutes, and the adhesive for electronic parts was cured to produce a semiconductor chip laminated body.
(Evaluation)

The adhesive for electronic parts and the semiconductor chip laminated bodies obtained in Examples 1 and 2, Comparative Examples 1 to 3, and Reference Example 1 were evaluated by the following method.

Table 1 shows the results.
(Measurement of Viscosity)

Using an E type viscometer (trade name: VISCOMETER TV-22, produced by TOKI SANGYO CO., LTD, rotor used: φ15 mm, set temperature: 25° C.), measurements were made on a viscosity (A) at a rotation frequency of 0.5 rpm, a viscosity (B) at 1 rpm, and a viscosity (C) at 10 rpm. Also, (A/B) and (B/C) were calculated as ratios of these viscosities.
(Amount of Sagging)

After applying the obtained adhesive for electronic parts to a silicon wafer so that the adhesive has a diameter of 1 cm and a height of 1 mm, the silicon wafer was perpendicularly left at rest, and an amount of travel of the adhesive for electronic parts at 25° C. was measured.
(Distance Variation Between Chips, Space Achievement Degree)

Ten samples of the semiconductor chip laminated bodies obtained in each of Examples 1 and 2, each of Comparative Examples 1 to 3, and Reference Example 1 were produced, and lamination condition of each semiconductor chip laminated body was measured using a laser displacement gauge (KS-1100, produced by KEYENCE Corporation). More specifically, a level difference between the upper surfaces of the chip 1 and the chip 2 was measured, a distance between the chip 1 and the chip 2 was determined by subtracting a chip thickness from the measured value, and thereby a distance variation between chips was calculated as 3σ (σ; standard deviation). Moreover, (distance between chips/average particle diameter of spacer fine particles) was calculated as a space achievement degree.
(Heat Resistance Test)

Each of the obtained semiconductor chip laminated body was dried at 125° C. for 6 hours and subjected to a 48-hour treatment at a humidity of 80% at 30° C., and subsequently a heating treatment was carried out thereon under conditions of 260° C. for 30 seconds, the same conditions upon solder reflowing. Then, the semiconductor chip laminated body obtained by performing the heating treatment three times was observed as to the occurrence of peeling between layers. The observation of peeling between layers was made using an ultrasonic imaging device (miscope hyper II, produced by Hitachi Kenki FineTech Co., Ltd.).

Moreover, the adhesive for electronic parts used for the semiconductor chip laminated body was removed with a mixed acid, and observation was made as to the generation of cracking of a silicon nitride protective film on the surface of the semiconductor chip.

Evaluation of heat resistance of the semiconductor chip laminated body was conducted by assessing peeling between layers and cracking of protective films by the following criteria.

◯: Peeling between layers and cracking of protective films were not observed.

Δ: Peeling between layers or cracking of protective films was slightly observed.

X: Peeling between layers or cracking of protective films was markedly observed.
(Thermal Cycle Test)

Each of the obtained semiconductor chip laminated bodies was subjected to a thermal cycle test in which one cycle was composed of the time duration of 9 minutes at −55° C. and 9 minutes at 125° C. The semiconductor chip laminated body obtained after 1,000 cycles was observed as to the occurrence of peeling between layers. Moreover, the adhesive for electronic parts used for the semiconductor chip laminated body was removed with a mixed acid, and observation was made as to the generation of cracking of a silicon nitride protective film on the surface of the semiconductor chip.

Evaluation was conducted on peeling between layers and cracking of protective films by the following criteria.

◯: Peeling between layers and cracking of protective films were not observed.

Δ: Peeling between layers or cracking of protective films was slightly observed.

X: Peeling between layers or cracking of protective films was markedly observed.

TABLE 1

|  |  |  |  | Example 1 | Example 2 | Comparative Example 1 | Comparative Example 2 | Comparative Example 3 | Reference Example 1 |
|---|---|---|---|---|---|---|---|---|---|
| Blending amount (parts by weight) | Adhesive composition | Curing compound | Dicyclopentadiene type epoxy resin | 20 | 20 | 20 | 35 | 35 | 20 |
|  |  |  | Naphthalene type epoxy resin | 76 | — | 76 | 51 | 51 | 86 |
|  |  |  | Fluorene type epoxy resin | — | 71 | — | — | — | — |
|  |  |  | Low-viscosity epoxy resin | — | 5 | — | — | — | — |
|  |  | Curing agent | Acid anhydride | 63 | 63 | 63 | 52 | 52 | 63 |
|  |  | Curing accelerator | Imidazole compound | 8 | 8 | 8 | 8 | 8 | 8 |
|  |  | Thixotropy providing agent | Fumed silica | 8 | 8 | 8 | 8 | 4 | 8 |
|  |  | Polymers having epoxy group | Epoxy group-containing acrylic resin | 4 | 4 | 4 | 4 | 4 | 4 |
|  |  | Rubber modified epoxy resin | CTBN modified epoxy resin | 10 | 10 | 10 | 10 | 10 | 0 |
|  | Spacer particle |  | Resin particle | 1 | 1 | — | 1 | 1 | 1 |
|  |  |  | Spherical silica | — | — | 1 | — | — | — |
| Evaluation | Viscosity (Pa · s) |  | 0.5 rpm (A) | 177 | 174 | 171 | 353 | 151 | 165 |
|  |  |  | 1 rpm (B) | 115 | 122 | 113 | 247 | 112 | 103 |
|  |  |  | 10 rpm (C) | 41 | 45 | 39 | 124 | 57 | 41 |
|  | Viscosity ratio |  | A/B | 1.5 | 1.4 | 1.5 | 1.4 | 1.3 | 1.6 |
|  |  |  | B/C | 2.8 | 2.7 | 2.9 | 2.0 | 2.0 | 2.5 |
|  | Amount of sagging (mm) |  |  | 0 | 0 | 0 | 0 | 3 | 0 |
|  | Space achievement degree |  |  | 100 | 100 | 30 | 70 | — | 100 |
|  | Distance variation between chips |  |  | 3.1 | 3 | 15 | 3 | — | 3 |
|  | Heat resistance test |  |  | ○ | ○ | ○ | ○ | — | ○ |
|  | Thermal cycle test |  |  | ○ | ○ | ○ | ○ | — | Δ |

Examples 3 to 7, Comparative Examples 4 to 7

Based on the composition of Table 2, the materials other than the below-mentioned spacer particles were mixed under stirring by using a homodisper to produce an adhesive composition. Spacer particles were blended in the resultant adhesive composition based on the composition of Table 2 and further mixed under stirring by using a homodisper to produce an adhesive for electronic parts. The blending amount of each composition indicates parts by weight in Table 2.
(Epoxy compound (A))
 Phenol type epoxy (EX-201, produced by Nagase & Co., Ltd., monomers, crystalline solid at 25° C., melting point: 30 to 60° C., viscosity: 250 mPa·s/50° C.)
 Crystalline epoxy resin (YSLV-80XY, produced by Tohto Kasei Co., Ltd., monomers, crystalline solid at 25° C., melting point: 80° C., viscosity: 1 Pa·s/80° C.)
(Epoxy Compound (B))
 Dicyclopentadiene type epoxy (EP-4088S, produced by ADEKA Corporation, monomers)
 Dicyclopentadiene type epoxy compound (HP-7200, produced by DIC Corporation, pentamers)
(Other Epoxy Compounds)
 Bisphenol A type epoxy compound (EP828, produced by Japan Epoxy Resins Co., Ltd., viscosity: 2 Pa·s/50° C.)
 Naphthalene type epoxy compound (HP-4032D, produced by DIC Corporation, liquid state at normal temperature, viscosity: 5 Pa·s/50° C.)
 Bisphenol A type epoxy compound (EP-1001, produced by Japan Epoxy Resins Co., Ltd., solid state at normal temperature, viscosity: 20 Pa·s/80° C.)
 Phenol type epoxy compound (EX-141, produced by Nagase & Co., Ltd., liquid state at normal temperature, viscosity: 7 mPa·s/50° C.)
 NBR modified bisphenol A type epoxy compound (EPR-4030, produced by ADEKA Corporation, liquid state at normal temperature, viscosity: 50 Pa·s/50° C.)

(Epoxy Group-Containing Acrylic Polymer Compound)
 Epoxy group-containing acrylic resin (BLEMMER CP-30, produced by Japan Epoxy Resins Co., Ltd.)
(Curing Agent)
 Acid anhydride (YH-306, produced by Japan Epoxy Resins Co., Ltd.)
(Curing Accelerator)
 Imidazole compound (2MA-OK, produced by Shikoku Chemicals Corporation)
 Thickener (R202, produced by NIPPON AEROSIL Co., Ltd.)
(Adhesion Providing Agent)
 Imidazole silane coupling agent (SP-1000, produced by Nikko Materials Co., Ltd.)
(Spacer Particles)
 Resin particles (Micropearl SP-210, produced by Sekisui Chemical Co., Ltd., average particle diameter: 10 μm, CV value: 4%)
(Production of Semiconductor Chip Laminated Body)
 The obtained adhesive for electronic parts was filled into a 10 mL syringe (produced by Iwashita Engineering, Inc.), a precision nozzle (produced by Iwashita Engineering, Inc., nozzle tip diameter: 0.3 mm) was attached to the tip of the syringe, and the adhesive was applied to a glass substrate in an application amount of 5 mg at a discharge pressure of 0.4 MPa by using a dispenser device (SHOT MASTER300, produced by Musashi Engineering, Inc.), with a gap between a semiconductor chip and a needle being set to 200 μm. With respect to the application amount, (application amount to the outer peripheral portion of the joining part/application amount to the central portion) was set to 4.
 After the application, a semiconductor chip (chip 1) (thickness: 80 μm, 8 mm×12 mm, mesh-like pattern, aluminum wiring: thickness: 0.7 μm, L/S=15/15, thickness of a silicon nitride film on the surface thereof: 1.0 μm) having 172 pieces of 110 μm pad openings in peripheral shape was pressed at a pressure of 0.15 MPa at a temperature of 60° C. or 80° C. for 5 seconds by using a flip chip bonder (DB-100, produced by Shibuya Kogyo Co., Ltd.), and thereby laminated. Subsequently, the adhesive for electronic parts was applied to the chip 1 by using the above-mentioned dispenser device, a semiconductor chip (chip 2) identical to the chip 1 was placed on the chip 1 in such a manner that the longer sides of the chip 1 cross the longer sides of the chip 2, and the chip 2 was pressed at a pressure of 0.15 MPa at a temperature of 60° C. or 80° C. for 5 seconds, and thereby laminated. Then, after the resultant product was left standing in a hot air blow drying furnace at 80° C. for 60 minutes, heating was performed thereon at 150° C. for 60 minutes, and the adhesive for electronic parts was cured to produce a semiconductor chip laminated body.

(Evaluation)

Each of the adhesive for electronic parts and each of the semiconductor chip laminated bodies obtained in Examples 3 to 7 and Comparative Examples 4 to 7 were evaluated by the following methods. Table 2 shows the results.

(Measurement of viscosity (1))

Using an E type viscometer (trade name: VISCOMETER TV-22, produced by TOKI SANGYO CO., LTD, rotor used: +15 mm, set temperature: 25° C.), measurements were made on a viscosity (A) at a rotation frequency of 0.5 rpm, a viscosity (B) at 1 rpm, and a viscosity (C) at 10 rpm. Also, (A/B) and (B/C) were calculated as ratios of these viscosities.

(Measurement of Viscosity (2))

Using an E type viscometer (trade name: VISCOMETER TV-22, produced by TOKI SANGYO CO., LTD, rotor used: φ15 mm, set temperature: 25° C.), measurements were made on a viscosity at a rotation frequency of 10 rpm and a viscosity at 10 rpm at 60° C. or 80° C.

(Application Shape Retention)

The case where application shape was lost after application on a glass substrate between immediately after application and lamination and the adhesive failed to maintain a favorable shape was rated as "X"; whereas the case where a favorable shape was maintained between immediately after application and lamination was rated as "○".

(Distance Variation Between Chips)

Ten samples of the semiconductor chip laminated bodies obtained in Examples 3 to 7, and Comparative Examples 4 to 7 were produced, and lamination condition of each semiconductor chip laminated body was measured using a laser displacement gauge (KS-1100, produced by KEYENCE Corporation). More specifically, a level difference between the upper surfaces of the chip 1 and the chip 2 was measured, a distance between the chip 1 and the chip 2 was measured by subtracting a chip thickness from the measured value, and thereby a distance variation between chips was calculated as 3σ (σ; standard deviation).

(Presence of Generation of Reflow Cracks)

After left standing in a constant temperature and humidity oven at a temperature of 85° C. and a humidity of 85% for 24 hours, the obtained semiconductor chip laminated body was charged into an IR reflow furnace in which the temperature was set to 230° C. or more for 20 seconds or more and the highest temperature was set to 260° C. After the charging, the presence of generation of reflow cracking of the semiconductor device was observed with scanning acoustic tomograph (SAT). Here, in Table 2, the number of occurrences of the reflow cracks was indicated as a fraction defective.

(Comprehensive Evaluation)

Comprehensive evaluation was made according to the following criteria on each of the adhesives for electronic parts and the semiconductor chip laminated bodies obtained in Examples 3 to 7 and Comparative Examples 4 to 7.

⊚: an adhesive excellent in application shape retention, with which a distance between chips was accurately controllable and a semiconductor chip laminated body was obtainable with a high reflow crack reliability.

○: an adhesive excellent in application shape retention, with which a distance between chips was accurately controllable but a semiconductor chip laminated body was obtainable with a slightly inferior reflow crack reliability.

X: an adhesive with which a distance between chips was not controllable with a sufficient degree accuracy.

TABLE 2

|  |  |  |  | Example 3 | Example 4 | Example 5 | Example 6 | Example 7 |
|---|---|---|---|---|---|---|---|---|
| Adhesive for electronic parts | Composition | Epoxy (A) | EX-201 | 40 | — | 20 | 30 | 10 |
|  |  |  | YSLV-80XY | — | — | — | — | — |
|  |  | Epoxy (B) | EP-4088S | — | 40 | 20 | 10 | 30 |
|  |  |  | HP-7200 | — | — | — | — | — |
|  |  | Other epoxies | EP-828 | 10 | 10 | 10 | 10 | 10 |
|  |  |  | HP-4032D | 50 | 50 | 50 | 50 | 50 |
|  |  |  | EP-1001 | — | — | — | — | — |
|  |  |  | EX-141 | — | — | — | — | — |
|  |  |  | EPR-4030 | — | — | — | — | — |
|  |  | Polymer | CP-30 | 2 | 2 | 2 | 2 | 2 |
|  |  | Curing agent | YH-306 | 74 | 74 | 74 | 74 | 74 |
|  |  | Curing catalyst | 2MA-OK | 9 | 9 | 9 | 9 | 9 |
|  |  | Additive | Thickener R202 | 8 | 8 | 8 | 8 | 8 |
|  |  | Silane coupling agent |  | 2 | 2 | 2 | 2 | 2 |
|  |  | Spacer | SP-210 | 0.1 | 0.1 | 0.1 | 0.1 | 0.1 |
| Evaluation | Viscosity (Pa·s) (25° C.) | 0.5 rpm (A) |  | 61 | 55 | 57 | 57 | 55 |
|  |  | 1 rpm (B) |  | 39 | 34 | 40 | 38 | 37 |
|  |  | 10 rpm (C) |  | 8 | 8 | 8 | 8 | 8 |
|  | Viscosity ratio | A/B |  | 1.6 | 1.6 | 1.4 | 1.5 | 1.5 |
|  |  | B/C |  | 4.9 | 4.3 | 5.0 | 4.8 | 4.6 |
|  | Temperature upon contact bonding |  |  | 60° C. | 60° C. | 60° C. | 60° C. | 60° C. |
|  | Viscosity (temperature upon contact bonding) |  |  | 0.2 | 3 | 1 | 0.7 | 2 |
|  | Application shape retention |  |  | ○ | ○ | ○ | ○ | ○ |
|  | Distance between chips (μm) |  |  | 10 | 10 | 10 | 10 | 10 |
|  | Height variation of chips (3σ) |  |  | 0.8 | 1.2 | 0.8 | 1.0 | 1.1 |
|  | Fraction defective |  |  | 2/6 | 2/6 | 0/6 | 1/6 | 1/6 |
|  | Comprehensive evaluation |  |  | ○ | ○ | ⊚ | ○ | ○ |

TABLE 2-continued

|  |  |  |  | Comparative Example 4 | Comparative Example 5 | Comparative Example 6 | Comparative Example 7 |
|---|---|---|---|---|---|---|---|
| Adhesive for electronic parts | Composition | Epoxy (A) | EX-201 | — | — | — | 40 |
|  |  |  | YSLV-80XY | — | — | — | — |
|  |  | Epoxy (B) | EP-4088S | — | — | — | — |
|  |  |  | HP-7200 | — | — | — | — |
|  |  | Other epoxies | EP-828 | 10 | 10 | 10 | 10 |
|  |  |  | HP-4032D | 50 | 60 | 60 | 50 |
|  |  |  | EP-1001 | 40 | — | — | — |
|  |  |  | EX-141 | — | 30 | — | — |
|  |  |  | EPR-4030 | — | — | 30 | — |
|  |  | Polymer | CP-30 | 2 | 2 | 2 | 2 |
|  |  | Curing agent | YH-306 | 74 | 74 | 74 | 74 |
|  |  | Curing catalyst | 2MA-OK | 9 | 9 | 9 | 9 |
|  |  | Additive | Thickener R202 | 8 | 8 | 8 | 8 |
|  |  | Silane coupling agent |  | 2 | 2 | 2 | 2 |
|  | Spacer |  | SP-210 | 0.1 | 0.1 | 0.1 | — |
| Evaluation | Viscosity (Pa·s) (25° C.) |  | 0.5 rpm (A) | 230 | 50 | 300 | 79 |
|  |  |  | 1 rpm (B) | 180 | 33 | 240 | 53 |
|  |  |  | 10 rpm (C) | 95 | 5 | 122 | 8 |
|  | Viscosity ratio |  | A/B | 1.3 | 1.5 | 1.3 | 1.5 |
|  |  |  | B/C | 1.9 | 6.6 | 2.0 | 6.6 |
|  | Temperature upon contact bonding |  |  | 60° C. | 60° C. | 60° C. | 60° C. |
|  | Viscosity (temperature upon contact bonding) |  |  | 20 | 0.2 | 31 | 0.2 |
|  | Application shape retention |  |  | ○ | X | ○ | ○ |
|  | Distance between chips (μm) |  |  | 23 | 10 | 35 | 5 |
|  | Height variation of chips (3σ) |  |  | 5.2 | 0.6 | 7.8 | 3.2 |
|  | Fraction defective |  |  | 0/6 | 6/6 | 1/6 | 2/6 |
|  | Comprehensive evaluation |  |  | X | X | X | X |

Examples 8 to 10, Comparative Example 8

Based on the composition of Table 3 shown below, the materials other than the below-mentioned spacer particles were mixed under stirring by using a homodisper to produce an adhesive composition. Spacer particles were blended in the resultant adhesive composition based on the composition of Table 3 and further mixed under stirring by using a homodisper to produce an adhesive for electronic parts. The blending amount of each composition indicates parts by weight in Table 3.
(Epoxy Compound)
Polybutadiene modified with bisphenol A glycidyl ether at both ends (EPB-13, produced by Nippon Soda Co., Ltd., semisolid at normal temperature)
Propylene oxide modified with glycidyl ether at both ends (EX-941, produced by Nagase & Co., Ltd., liquid at normal temperature)
(Other Epoxy Compounds)
Bisphenol A type epoxy compound (EP-828, produced by Japan Epoxy Resins Co., Ltd., viscosity: 2 Pa·s/50° C.)
(Curing Agent)
Bifunctional acid anhydride type curing agent (YH-306, produced by Japan Epoxy Resins Co., Ltd., liquid at normal temperature)
Particles consisting of tetrafunctional acid anhydride curing agent (B-4400, produced by DIC Corporation, solid at normal temperature, average particle diameter: 3 μm)
(Curing Accelerator)
Imidazole curing accelerator (2MA-OK, produced by Shikoku Chemicals Corporation)
(Reactive Diluent)
Dicyclopentadiene type epoxy (EP-4088S, produced by ADEKA Corporation, monomers)
(Thixotropy Providing Agent)
Hydrophobic fumed silica (MT-10, produced by TOKUYAMA Corp.)
(Adhesion Providing Agent)
Imidazole silane coupling agent (SP-1000, produced by Nikko Materials Co., Ltd.)
(Spacer Particles)
Resin particles (Micropearl SP-210, produced by Sekisui Chemical Co., Ltd., average particle diameter: 10 μm, CV value: 4%)
(Evaluation)
The following evaluation was made on each of the adhesives for electronic parts prepared in Examples 8 to 10 and Comparative Example 8. Table 3 shows the results.
(Measurement of Viscosity)
Using an E type viscometer (trade name: VISCOMETER TV-22, produced by TOKI SANGYO CO., LTD, rotor used: φ15 mm, set temperature: 25° C.), measurements were made on a viscosity (A) at a rotation frequency of 0.5 rpm, a viscosity (B) at 1 rpm, and a viscosity (C) at 10 rpm. Also, (A/B) and (B/C) were calculated as ratios of these viscosities.
(Measurement of Tensile Strength)
The adhesives for electronic parts prepared in Examples 8 to 10 and Comparative Example 8 were put into a die of 2 mm×5 mm×50 mm, and cured at 170° C. for 15 minutes, and thereafter, the cured material was pulled with hand. At that time, the case where the cured material was easily torn was rated as "X", the cases of higher strengths were rated as "Δ" and "○" in this order, and the case where the cured material was not torn was rated as "⊚".
(Production of Semiconductor Chip Laminated Body)
The obtained adhesive for electronic parts was filled into a 10 mL syringe (produced by Iwashita Engineering, Inc.), a precision nozzle (produced by Iwashita Engineering, Inc., nozzle tip diameter: 0.3 mm) was attached to the tip of the syringe, and the adhesive was applied to a glass substrate in an application amount of 5 mg at a discharge pressure of 0.4 MPa by using a dispenser device (SHOT MASTER300, produced by Musashi Engineering, Inc.), with a gap between a semiconductor chip and a needle being set to 200 μm. With respect to the application amount, (application amount to the outer peripheral portion of the joining part/application amount to the central portion) was set to 4.

After the application, a semiconductor chip (chip 1) (thickness: 80 μm, 10 mm×10 mm, mesh-like pattern, aluminum wiring: thickness: 0.7 μm, L/S=15/15, thickness of a silicon nitride film on the surface thereof: 1.0 μm) having 172 pieces of 110 μm pad openings in peripheral shape was pressed and thereby laminated, at a pressure of 0.1 MPa at normal temperature for 5 seconds, by using a flip chip bonder (DB-100, produced by Shibuya Kogyo Co., Ltd.). Then, heating was performed at 170° C. for 15 minutes, the adhesive for electronic parts was cured to produce a semiconductor chip laminated body.

⊚: number of occurrence of reflow cracks 0/6
○: number of occurrence of reflow cracks 1/6

(Comprehensive Evaluation)

Comprehensive evaluation was made on each of the adhesives for electronic parts and each of the semiconductor chip laminated bodies obtained in Examples 8 to 10 and Comparative Example 8. The case where the warpage of the semiconductor chip was evaluated to be 50 μm or less was rated as "⊚", the case where the warpage of the semiconductor chip was evaluated to be less than 100 μm was rated as "○", and the case where the warpage of the semiconductor chip was evaluated to be 100 μm or more was rated as "X".

TABLE 3

| | | | Example 8 | Example 9 | Example 10 | Comparative Example 8 |
|---|---|---|---|---|---|---|
| Composition (parts by weight) | Flexible epoxy | EPB-13 | 50 | 40 | 50 | — |
| | | EX-941 | 20 | 30 | 30 | — |
| | General epoxy | EP-828 | — | — | — | 60 |
| | Reactive diluent | EP-4088S | 30 | 30 | 20 | 40 |
| | Curing agent | YH-306 | 10 | 10 | 10 | 50 |
| | | B-4400 | 20 | 20 | 20 | — |
| | Curing accelerator | 2MA-OK | 6 | 6 | 6 | 6 |
| | Thixotropy providing agent | MT-10 | 6 | 6 | 6 | 6 |
| | Spacer particle | SP-210 | 0.1 | 0.1 | 0.1 | 0.1 |
| Evaluation | Viscosity (Pa·s)(25° C.) | 0.5 rpm (A) | 50 | 52 | 55 | 30 |
| | | 1 rpm (B) | 35 | 36 | 36 | 25 |
| | | 10 rpm (C) | 15 | 13 | 13 | 10 |
| | Viscosity ratio | A/B | 1.4 | 1.4 | 1.5 | 1.2 |
| | | B/C | 2.3 | 2.8 | 2.8 | 2.5 |
| | Laminated body | Tensile strength | ⊚ | ⊚ | ⊚ | ⊚ |
| | | Chip warpage amount (μm) | 30 | 40 | 80 | 250 |
| | | Evaluation of wire bonding property | ○ | ○ | ○ | X |
| | | Evaluation of reflow resistance property | ⊚ | ⊚ | ⊚ | ○ |
| | | Thermal cycle test | ⊚ | ⊚ | ⊚ | X |
| | | Comprehensive evaluation | ⊚ | ⊚ | ○ | X |

(Measurement of Warpage Amount of Semiconductor Chip)

A warpage amount of the produced semiconductor chip was measured with a laser displacement gauge (LT9010M, KS-1100, produced by KEYENCE Corporation) along the diagonal line of the semiconductor chip of the produced semiconductor chip laminated body.

(Evaluation of Wire Bonding Properties)

Just like the case of the semiconductor chip laminated body, a semiconductor chip (chip 2) (thickness: 80 μm, 3 mm×3 mm, mesh-like pattern, aluminum wiring: thickness: 0.7 μm, L/S=15/15, thickness of a silicon nitride film on the surface thereof: 1.0 μm) was laminated on the substrate. Then, this laminated body was cured at 170° C. for 15 minutes. Subsequently, wire bonding was performed by virtue of a wire with a diameter of 25 μm using a wire bonder UTC2000 (produced by Shinkawa Ltd.). This wire was pulled at its wire neck portion. The case where the wire was cut with the wire neck was rated as "○", and the case where the wire was cut at its joining part was rated as "X".

(Evaluation of Reflow Resistance Property)

After left standing in a constant temperature and humidity oven at a temperature of 85° C. and a humidity of 85% for 24 hours, the obtained semiconductor chip laminated body was three times charged into an IR reflow furnace in which the temperature was set to 230° C. or more for 20 seconds or more and the highest temperature was set to 260° C. After the charging, the presence of generation of reflow cracks of the semiconductor device was observed with ultrasonic test equipment (SAT) and evaluated according to the following criteria.

INDUSTRIAL APPLICABILITY

According to the present invention, it is possible to provide: an adhesive for electronic parts that makes it possible to accurately maintain a distance between electronic parts upon joining the electronic parts such as two or more semiconductor chips and also to obtain reliable electronic parts such as a semiconductor device; a method for producing a semiconductor chip laminated body using the adhesive for electronic parts; and a semiconductor device using the adhesive for electronic parts.

Figure 1:
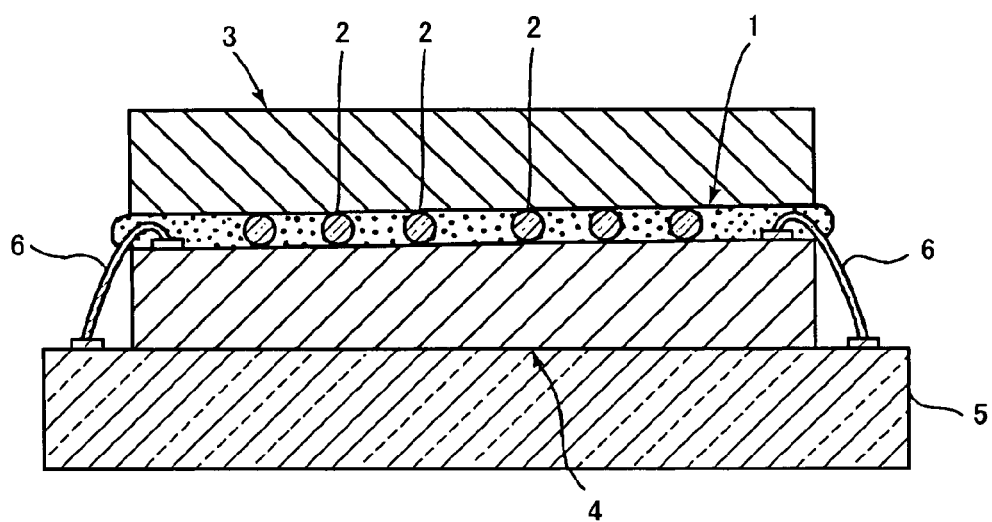
FIG. 1 is a cross-sectional view schematically illustrating an example of a semiconductor chip laminated by using an adhesive for electronic parts of the present invention.

The invention claimed is:

1. An adhesive for electronic parts configured to join the electronic parts,
    which contains: an adhesive composition comprising a curing compound and a curing agent; and spacer particles having a CV value of 10% or less,
    a viscosity at 1 rpm being 200 Pa·s or less and a viscosity at 10 rpm being 100 Pa·s or less, upon being measured at 25° C. by using an E type viscometer, and
    a viscosity at 0.5 rpm being 1.4 to 3 times as large as the viscosity at 1 rpm, and the viscosity at 1 rpm being 2 to 5 times as large as the viscosity at 10 rpm.

2. The adhesive for electronic parts according to claim 1, wherein the viscosity at 10 rpm is 1 Pa·s or less upon being measured at 50 to 100° C. by using the E type viscometer.

3. The adhesive for electronic parts according to claim 1, wherein the curing compound has a molecular structure of a deca- or less-mer with an aromatic ring in its repeat unit and contains an epoxy compound (A) existing as a crystalline solid at 25° C.

4. The adhesive for electronic parts according to claim 1, wherein the curing compound contains 40% by weight or more of at least one resin selected from the group consisting of a naphthalene type epoxy resin, a fluorene type epoxy resin, and a resorcinol type epoxy resin.

5. The adhesive for electronic parts according to claim 1, wherein the curing compound has epoxy groups at both ends of a molecule and contains an epoxy compound (B) having a flexible skeleton having a number-average molecular weight of 50 to 1,000 between one epoxy group and the other epoxy group.

6. The adhesive for electronic parts according to claim 5, wherein the flexible skeleton derives from at least one compound selected from the group consisting of butadiene rubber, propylene oxide, ethylene oxide, acrylic rubber, and their hydrogenated products.

7. The adhesive for electronic parts according to claim 5, wherein the epoxy compound (B) further contains an aromatic skeleton in a molecule.

8. The adhesive for electronic parts according to claim 7, wherein a glycidyl ether group is directly bonded with the aromatic skeleton.

9. The adhesive for electronic parts according to claim 1, which further contains a polymer compound having a functional group reactable with the curing compound.

10. The adhesive for electronic parts according to claim 1, which contains: particles comprising a polyfunctional acid anhydride type curing agent in a solid state at normal temperature; and a curing accelerator.

11. The adhesive for electronic parts according to claim 1, which contains: particles including a polyfunctional acid anhydride type curing agent in a solid state at normal temperature; and a bifunctional acid anhydride type curing agent in a liquid state at normal temperature.

12. The adhesive for electronic parts according to claim 11, which further contains a curing accelerator.

13. The adhesive for electronic parts according to claim 1, which contains: inorganic fine particles (A) having a solubility parameter (SP value) of a liquid component of 8 to 11, an average primary particle diameter of 50 nm or less, and a hydrophobic degree (M value) of 50 or less; and inorganic fine particles (B) having an average primary particle diameter of 50 nm or less and a hydrophobic degree (M value) of 60 or more.

14. The adhesive for electronic parts according to claim 1, which contains: inorganic fine particles (C) having a solubility parameter (SP value) of a liquid component of 11 to 14, an average primary particle diameter of 50 nm or less, and a hydrophobic degree (M value) of 40 or less; and inorganic fine particles (D) having an average primary particle diameter of 50 nm or less and a hydrophobic degree (M value) of 50 or more.

15. The adhesive for electronic parts according to claim 1, wherein each of the electronic parts is a semiconductor chip.

16. A method for producing a semiconductor chip laminated body, in which two or more semiconductor chips are laminated by interposing an adhesive for electronic parts according to claim 1,
which comprises:
an application step (1) of applying said adhesive for electronic parts to one semiconductor chip;
a semiconductor chip laminating step (2) of laminating an other semiconductor chip by interposing an adhesive for electronic parts applied to said one semiconductor chip;
a curing step (3) of curing the adhesive for electronic parts between said one semiconductor chip and said other semiconductor chip,
in said application step (1), said adhesive for electronic parts being applied to an outer peripheral part and a central part of a region of said one semiconductor chip on which said other semiconductor chip is laminated, and
an application amount of said adhesive for electronic parts to the outer peripheral part being 2 to 5 times as much as an application amount of the adhesive to a central part.

17. The method for producing a semiconductor chip laminated body according to claim 16, which comprises pressing against the other semiconductor chip laminated on the one semiconductor chip for 0.1 to 5 seconds at 0.01 to 0.5 MPa in the semiconductor chip laminating step (2).

* * * * *